US008860861B2

(12) United States Patent
Aoyama

(10) Patent No.: US 8,860,861 B2
(45) Date of Patent: Oct. 14, 2014

(54) PIXEL, PIXEL FORMING METHOD, IMAGING DEVICE AND IMAGING FORMING METHOD

(75) Inventor: Chiaki Aoyama, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 266 days.

(21) Appl. No.: 13/057,221

(22) PCT Filed: Aug. 7, 2009

(86) PCT No.: PCT/JP2009/003815
§ 371 (c)(1),
(2), (4) Date: Feb. 2, 2011

(87) PCT Pub. No.: WO2010/018677
PCT Pub. Date: Feb. 18, 2010

(65) Prior Publication Data
US 2011/0134298 A1 Jun. 9, 2011

(30) Foreign Application Priority Data

Aug. 11, 2008 (JP) ................. 2008-207171

(51) Int. Cl.
H04N 3/14 (2006.01)
H04N 5/335 (2011.01)
H01L 27/00 (2006.01)
H01L 27/148 (2006.01)
H01L 27/14 (2006.01)
H01L 27/146 (2006.01)
H04N 5/3745 (2011.01)
H04N 5/355 (2011.01)

(52) U.S. Cl.
CPC ..... *H01L 27/14609* (2013.01); *H01L 27/14603* (2013.01); *H04N 5/37452* (2013.01); *H04N 5/3559* (2013.01); *H04N 5/3745* (2013.01)
USPC ........ 348/308; 348/302; 348/303; 250/208.1; 257/222; 257/431; 257/443

(58) Field of Classification Search
USPC ............ 348/22.1, 294–324, 222.1; 250/208.1
See application file for complete search history.

(56) References Cited

U.S. PATENT DOCUMENTS 6,900,480 B2 * 5/2005 Sugiyama ..................... 257/222
6,977,684 B1 * 12/2005 Hashimoto et al. ........... 348/294

(Continued)

FOREIGN PATENT DOCUMENTS

EP 2 296 368 A1 3/2011
JP 02-094665 4/1990

(Continued)

OTHER PUBLICATIONS

Mitsuhito Mase et al., A Wide Dynamic Range CMOS Image Sensor with Multiple Exposure-Time Signal Outputs and 12-bit Column-Parallel Cyclic A/D Converters, IEEE Journal of Solid-State Circuits, vol. 40, No. 12, Dec. 2005, pp. 2787-2795.

(Continued)

*Primary Examiner* — Michael Osinski
(74) *Attorney, Agent, or Firm* — Squire Patton Boggs (US) LLP

(57) ABSTRACT

A pixel is provided with a photodiode region which includes a photoelectric conversion portion for receiving light and generating electrons, and a charge storage portion for storing electric charge. The pixel is configured in such a manner that an electron exclusion region is provided in the photodiode region with the diameter of a circle having the maximum diameter among circles that can exist in the surface of a region through which electrons can pass in the photodiode region as the width of an electron passage region in the photodiode region, and the width of the electron passage region is smaller than when the electron exclusion region is not provided.

3 Claims, 30 Drawing Sheets

(56) References Cited

U.S. PATENT DOCUMENTS

| | | | |
|---|---|---|---|
| 7,244,920 B2* | 7/2007 | Kim et al. | 250/208.1 |
| 7,714,917 B2* | 5/2010 | McKee | 348/294 |
| 8,223,238 B2* | 7/2012 | Kuroda et al. | 348/308 |
| 8,242,547 B2* | 8/2012 | Kudoh | 257/292 |
| 8,264,579 B2* | 9/2012 | Paik et al. | 348/308 |
| 8,471,938 B2* | 6/2013 | Altice et al. | 348/296 |
| 8,531,567 B2* | 9/2013 | Roy et al. | 348/308 |
| 8,633,524 B2* | 1/2014 | Nomoto et al. | 257/292 |
| 8,659,688 B2* | 2/2014 | Wakano et al. | 348/294 |
| 2003/0136981 A1* | 7/2003 | Sugiyama | 257/222 |
| 2004/0021058 A1* | 2/2004 | Drowley et al. | 250/208.1 |
| 2004/0051801 A1* | 3/2004 | Iizuka et al. | 348/294 |
| 2005/0110093 A1* | 5/2005 | Altice et al. | 257/359 |
| 2005/0189601 A1* | 9/2005 | Sugiyama | 257/432 |
| 2005/0194617 A1* | 9/2005 | Sugiyama | 257/222 |
| 2005/0199923 A1* | 9/2005 | Sugiyama | 257/292 |
| 2005/0212937 A1* | 9/2005 | Koyama | 348/301 |
| 2006/0180745 A1* | 8/2006 | Lee | 250/214.1 |
| 2006/0197007 A1* | 9/2006 | Iwabuchi et al. | 250/208.1 |
| 2006/0223212 A1* | 10/2006 | Jang | 438/48 |
| 2006/0289911 A1 | 12/2006 | Lee et al. | |
| 2007/0040922 A1* | 2/2007 | McKee et al. | 348/308 |
| 2007/0046796 A1* | 3/2007 | McKee | 348/294 |
| 2007/0128954 A1* | 6/2007 | Itonaga | 439/852 |
| 2007/0278533 A1* | 12/2007 | Mabuchi et al. | 257/230 |
| 2008/0079833 A1 | 4/2008 | Ichikawa et al. | |
| 2008/0108166 A1* | 5/2008 | Park et al. | 438/59 |
| 2009/0008686 A1* | 1/2009 | Maeda et al. | 257/292 |
| 2009/0101914 A1* | 4/2009 | Hirotsu et al. | 257/72 |
| 2009/0140304 A1* | 6/2009 | Kudoh | 257/292 |
| 2009/0250733 A1* | 10/2009 | Adkisson et al. | 257/292 |
| 2010/0141769 A1 | 6/2010 | Kato | |
| 2011/0063470 A1* | 3/2011 | Kudoh | 348/222.1 |
| 2011/0128400 A1* | 6/2011 | Wakano et al. | 348/222.1 |
| 2011/0163362 A1* | 7/2011 | Park et al. | 257/292 |
| 2011/0273597 A1* | 11/2011 | Ishiwata | 348/272 |
| 2011/0303822 A1* | 12/2011 | Mayer | 250/208.1 |

FOREIGN PATENT DOCUMENTS

| | | |
|---|---|---|
| JP | 02-304974 | 12/1990 |
| JP | 2002-199284 | 7/2002 |
| JP | 2004-56048 A | 2/2004 |
| JP | 2004-186408 | 7/2004 |
| JP | 2004-228524 | 8/2004 |
| JP | 2005-159067 | 6/2005 |
| JP | 2005-164363 A | 6/2005 |
| JP | 2006-041189 A | 2/2006 |
| JP | 2007-073864 A | 3/2007 |
| JP | 2007-081083 A | 3/2007 |
| JP | 2007-158547 | 6/2007 |
| JP | 2008-060195 A | 3/2008 |
| JP | 2008-60621 A | 3/2008 |
| WO | 2007/142171 A1 | 12/2007 |

OTHER PUBLICATIONS

European Search Report application No. 11192756.2 dated Mar. 12, 2012.

European Search Report application No. 09806573.3 dated Sep. 21, 2011.

Japanese Office Action mailed Aug. 27, 2013, issued in corresponding Japanese Patent Application No. 2010-524664.

* cited by examiner

PIXEL, PIXEL FORMING METHOD, IMAGING DEVICE AND IMAGING FORMING METHOD

BACKGROUND OF THE INVENTION

1. Field of the Invention

The present invention relates to a pixel with a short charge transfer time, a forming method thereof, an imaging device and an image forming method by which an image with a wide dynamic range can be formed.

2. Background Art

Conventionally, a relationship between a shape of a photodiode region of a pixel and charge transfer time has not been clear. A conventional pixel is described in Patent Document 1, for example.

Methods for forming a pixel with a wide dynamic range include that in which non-linearity of a semiconductor element is used (for example, Patent Document 2) and that in which images of different periods of exposure time are combined (for example, Non-Patent Document 1). However, in the method in which non-linearity of a semiconductor element is used, the non-linearity is affected by temperature and in some cases correction for temperature is not easy. Further, in the method in which images of different periods of exposure time are combined, images picked up at different time points and therefore an image of a moving object can hardly be formed with a high accuracy.

Thus, conventionally, a pixel in which a shape of the photodiode region is determined in such a way+that a charge transfer time is reduced has not been developed. Further, an imaging device and an image forming method by which an image of a moving object with a wide dynamic range can be formed with a high accuracy have not been developed.

PRIOR ART DOCUMENT

Patent Document

Patent Document 1: JP2-304974A
Patent Document 2: JP2007-158547A

Non-Patent Document

Non-Patent Document 1: Mitsuhito Mase et. Al., "A Wide Dynamic Range CMOS Image Sensor With Multiple Exposure-Time Signal Outputs and 12-bit Column-Parallel Cyclic A/D Converters", IEEE JOURNAL OF SOLID-STATE CIRCUITS, VOL. 40, NO. 12, pp. 2787-2795, DECEMBER 2005

SUMMARY OF THE INVENTION

Problem to be Solved by the Invention

Accordingly, there is a need for a pixel in which a shape of the photodiode region is determined such that a charge transfer time is reduced. Further, there is a need for an imaging device and an image forming method by which an image of a moving object with a wide dynamic range can be formed with a high accuracy.

Means for Solving the Problem

A pixel according to the present invention includes a photodiode region including a photoelectric converting section which generates electrons when receiving light and a charge storage section for storing charge. In the pixel, when a maximum diameter among diameters of circles which can exist in an area in the photodiode region through which free electrons can pass is referred to as a width of a free electron passing region in the photodiode region, an electron exclusion region is provided within the photodiode region to reduce the width of the free electron passing region compared with the case in which an electron exclusion region is not provided.

In the pixel according to the present invention, an electron exclusion region is provided in the photodiode region to reduce the width of the free electron passing region so that an appropriate charge transfer time can be realized.

A method for producing a pixel according to the present invention is that for a pixel comprising a photodiode region including a photoelectric converting section which generates electrons when receiving light and a charge storage section, an electron exclusion region being provided within the photodiode region. The method includes the steps of determining a plurality of values of width of a free electron passing region in the photodiode region which means a maximum diameter among diameters of circles which can exist in an area in the photodiode region through which free electrons can pass, adjusting shapes of the photodiode region and the electron exclusion region to determine shapes of pixels having the plurality of values of width of the free electron passing region, measuring or estimating charge transfer time of the pixels having the plurality of values of width of the free electron passing region, and selecting the pixel which shows a minimum charge transfer time.

In the method for producing a pixel according to the present invention, shapes of the photodiode region and the electron exclusion region are adjusted to obtain periods of charge transfer time for elements with different values of width of the free electron passing region and the pixel having a minimum charge transfer time is selected. In this way, a pixel having a minimum charge transfer time can be produced.

An imaging device according to the present invention includes a pixel including a photosensitive section including a photoelectric converting section, a plurality of charge storage sections, and a plurality of gates for supplying charge to the plurality of charge storage sections respectively and an imaging control section which controls the plurality of gates in such a way that charge is stored successively in each of the plurality of charge storage sections of each pixel for its own exposure time and the successive charging operations are repeated. The imaging control section controls the plurality of gates in such a way that outputs caused by amounts of charge stored in at least two of the plurality of charge storage sections of each pixel for an object are different.

A method for forming an image according to the present invention is that with imaging means including a pixel including a photoelectric converting section and a plurality of charge storage sections which function independently. In the present method, amounts of charge are stored successively in at least two of the plurality of charge storage sections of each pixel for an object in such a way that outputs caused by the amounts of charge stored in the at least two of the plurality of charge storage sections are different, the successive charging operations are repeated and then an image is formed based on the outputs of the plurality of charge storage sections of each pixel.

According to the present invention, an image with a wide dynamic range can be formed by utilizing outputs caused by amounts of charge which are stored in the plurality of charge storage sections of each pixel for an object in such a way that the outputs are different. Further, in the present invention, charge is stored successively in each of the plurality of charge storage sections of each pixel for its own exposure time and the successive charging operations are repeated, and then outputs caused by amounts of charge stored in the plurality of charge storage sections are obtained. Accordingly, an image of an moving object can be formed with a high accuracy.

MODE FOR CARRYING OUT THE INVENTION

Figure 1:
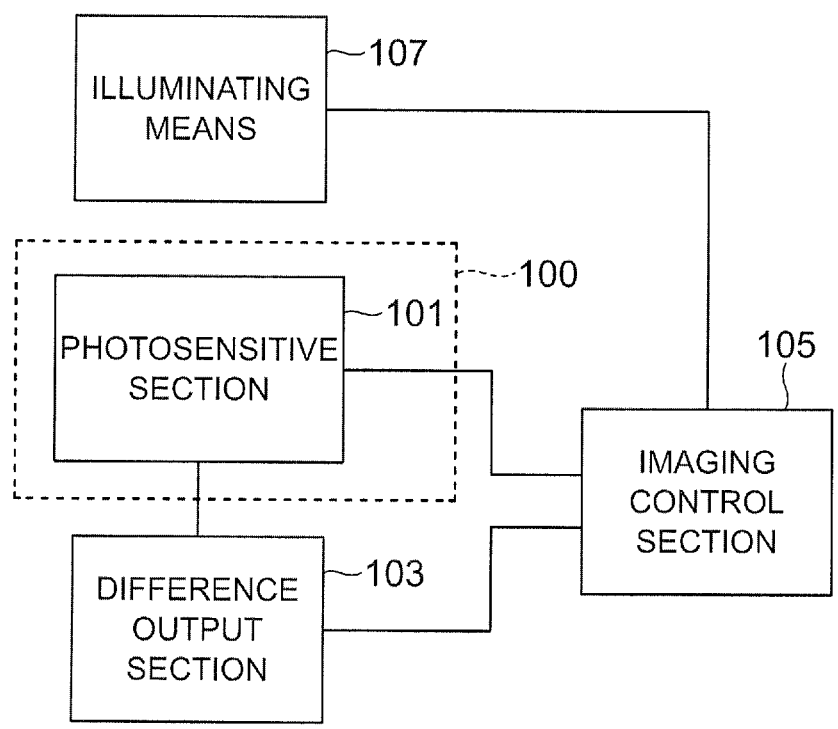
FIG. 1 shows a configuration of an imaging device according to the first embodiment of the present invention.

FIG. 1 shows a configuration of an imaging device according to the first embodiment of the present invention. The imaging device includes a pixel unit 100 including a photosensitive section 101, a difference output section 103, an imaging control section 105 and illuminating means 107. The imaging control section 105 controls the photosensitive section 101 of the pixel unit 100 and the illuminating means 107 in such a way that the photosensitive section 101 of the pixel unit 100 generates a plurality of outputs under different illuminating conditions. The photosensitive section 101 of the pixel unit 100 generates a plurality of outputs under different illuminating conditions and the difference output section 103 forms an image with a wide dynamic range based on differences between the plurality of outputs. Construction and function of each component of the imaging device will be described in detail later.

Figure 2:
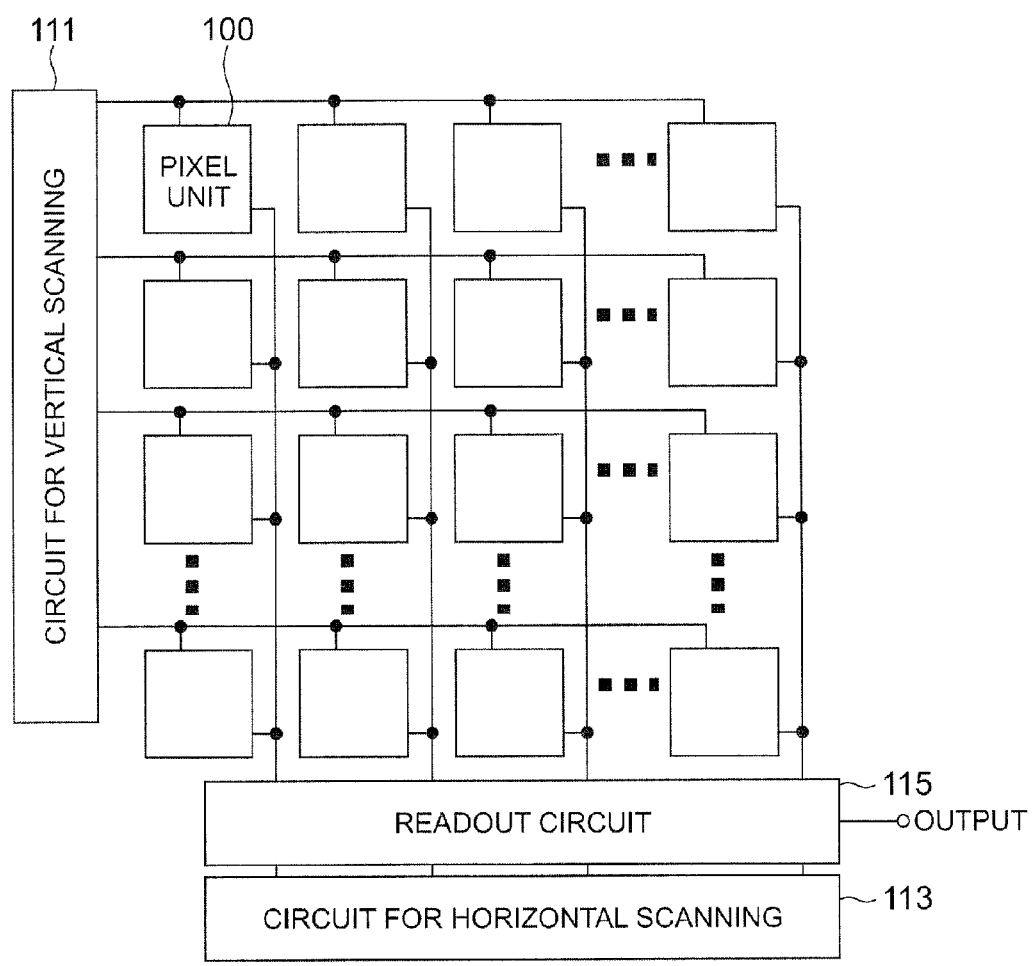
FIG. 2 shows a configuration of an array of the pixel units according to the present embodiment.

FIG. 2 shows a configuration of an array of pixel units 100 according to the present embodiment. Like conventional pixel arrays, outputs of the array of pixel units 100 are scanned by a circuit for vertical scanning 111 and a circuit for horizontal scanning 113 and then read one after another by a readout circuit 115. The difference output section 103 is included in the readout circuit 115 and forms an image with a wide dynamic range based on differences between the plurality of outputs of each pixel unit 100.

Figure 3:
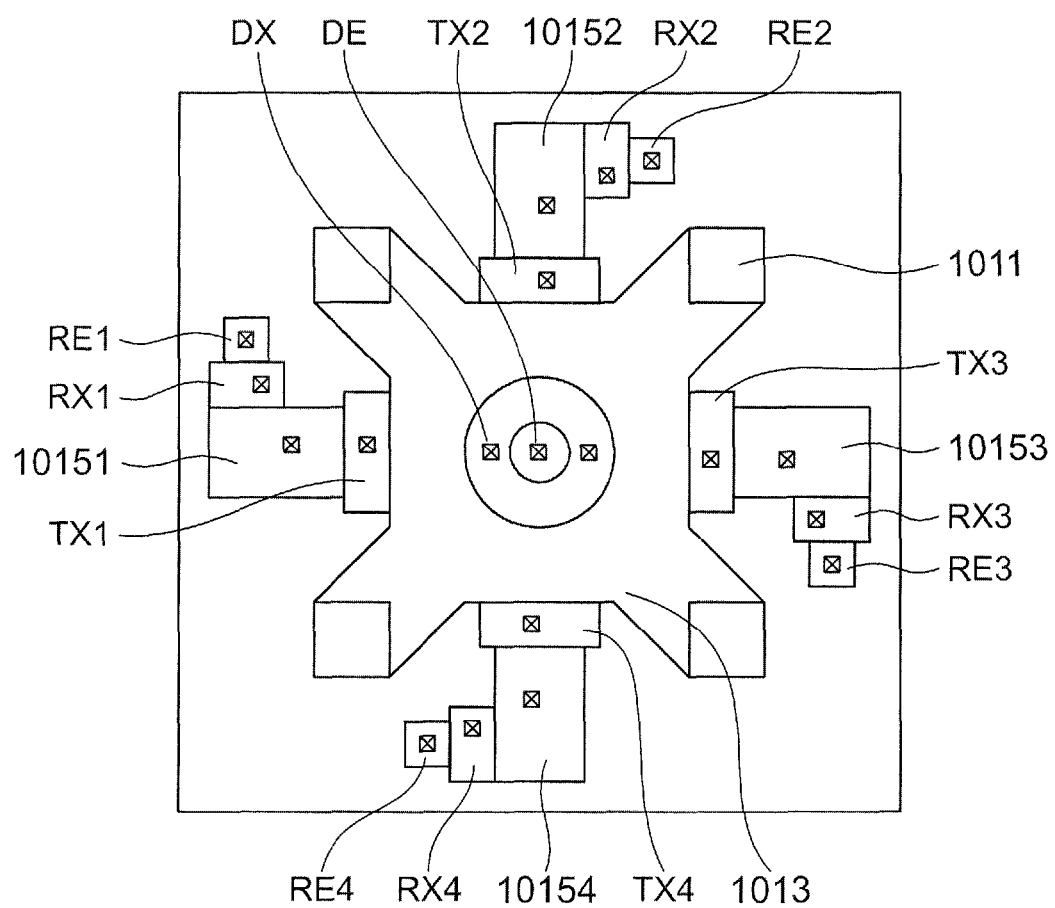
FIG. 3 shows a configuration of the photosensitive section of the pixel unit

FIG. 3 shows a configuration of the photosensitive section 101 of the pixel unit 100 according to the present embodiment. The photosensitive section 101 is provided with a drain electrode DE, a drain gate section DX, photoelectric converting sections 1011, a charge transfer section 1013, four transfer gate sections TX1, TX2, TX3 and TX4, four charge storage sections 10151, 10152, 10153 and 10154, four reset gate sections RX1, RX2, RX3 and RX4 and four reset electrodes RE1, RE2, RE3 and RE4.

Charge generated by the photoelectric converting sections 1011 is collected in the charge transfer section 1013. The charge collected in the charge transfer section 1013 is transferred to one of the four charge storage sections 10151, 10152, 10153 and 10154 respectively through the four transfer gate sections TX1, TX2, TX3 and TX4. The imaging control section 105 not shown in FIG. 3 controls operation of the illuminating means 107 not shown in FIG. 3 and the four transfer gate sections TX1, TX2, TX3 and TX4 in such a way that the charge collected in the charge transfer section 1013 can be transferred to one of the four charge storage sections 10151, 10152, 10153 and 10154. The procedure described above will be described in more detail later. Differences between amounts of charge stored in the four charge storage sections 10151, 10152, 10153 and 10154 are read by the difference output section 103 of the readout circuit 115. The four reset gate sections RX1, RX2, RX3 and RX4 and the four reset electrodes RE1, RE2, RE3 and RE4 are used to discharge charge stored in the four charge storage sections 10151, 10152, 10153 and 10154, respectively. The imaging control section 105 not shown in FIG. 3 has the four reset gate sections RX1, RX2, RX3 and RX4 operate to respectively discharge charge stored in the four charge storage sections 10151, 10152, 10153 and 10154.

Figure 4:
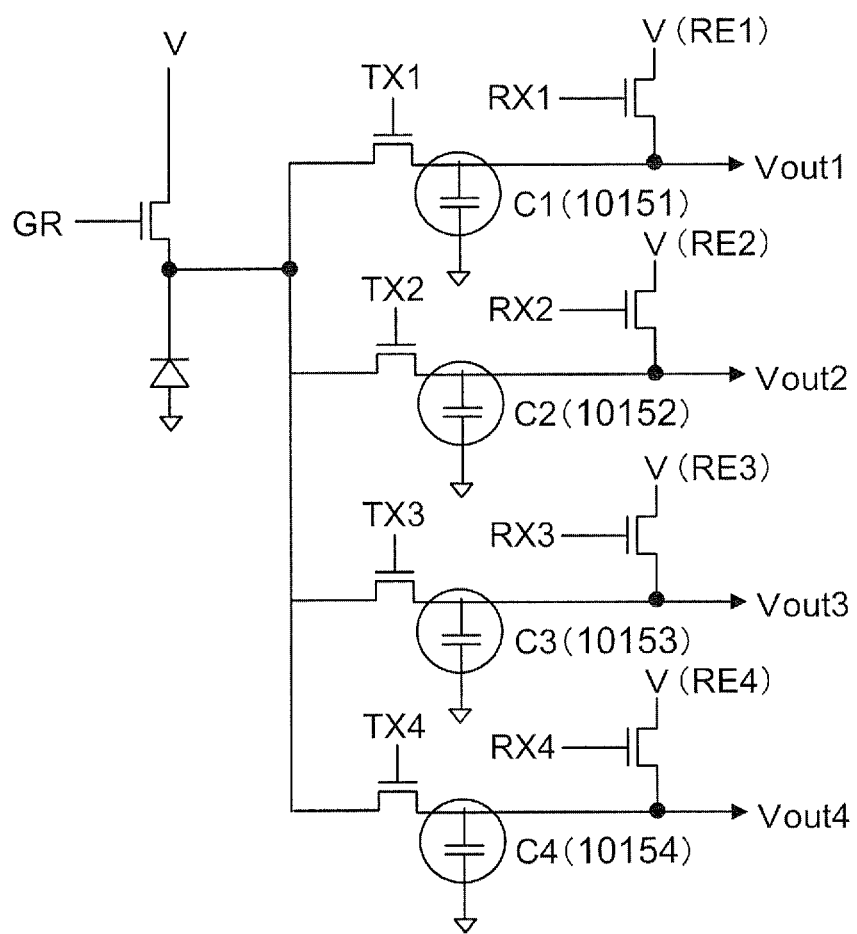
FIG. 4 is a circuit diagram for illustrating function of the photosensitive section of the pixel unit according to the present embodiment.

FIG. 4 is a circuit diagram for illustrating function of the photosensitive section 101 of the pixel unit 100 according to the present embodiment. The four charge storage sections 10151, 10152, 10153 and 10154 are represented as capacitors C1, C2, C3 and C4, respectively. In the present embodiment, the imaging control section 105 controls operation of the transfer gate sections TX1, TX2, TX3 and TX4 in such a way that charge is collected in the charge transfer section 1013 and then stored in the capacitors C1, C2, C3 and C4, respectively under different conditions (exposure time, illumination condition and the like) and the operation is performed repeatedly. Accordingly, different amounts of charge collected under different conditions (exposure time, illumination condition and the like) are integrated in the capacitors C1, C2, C3 and C4 by the repetition.

Figure 5:
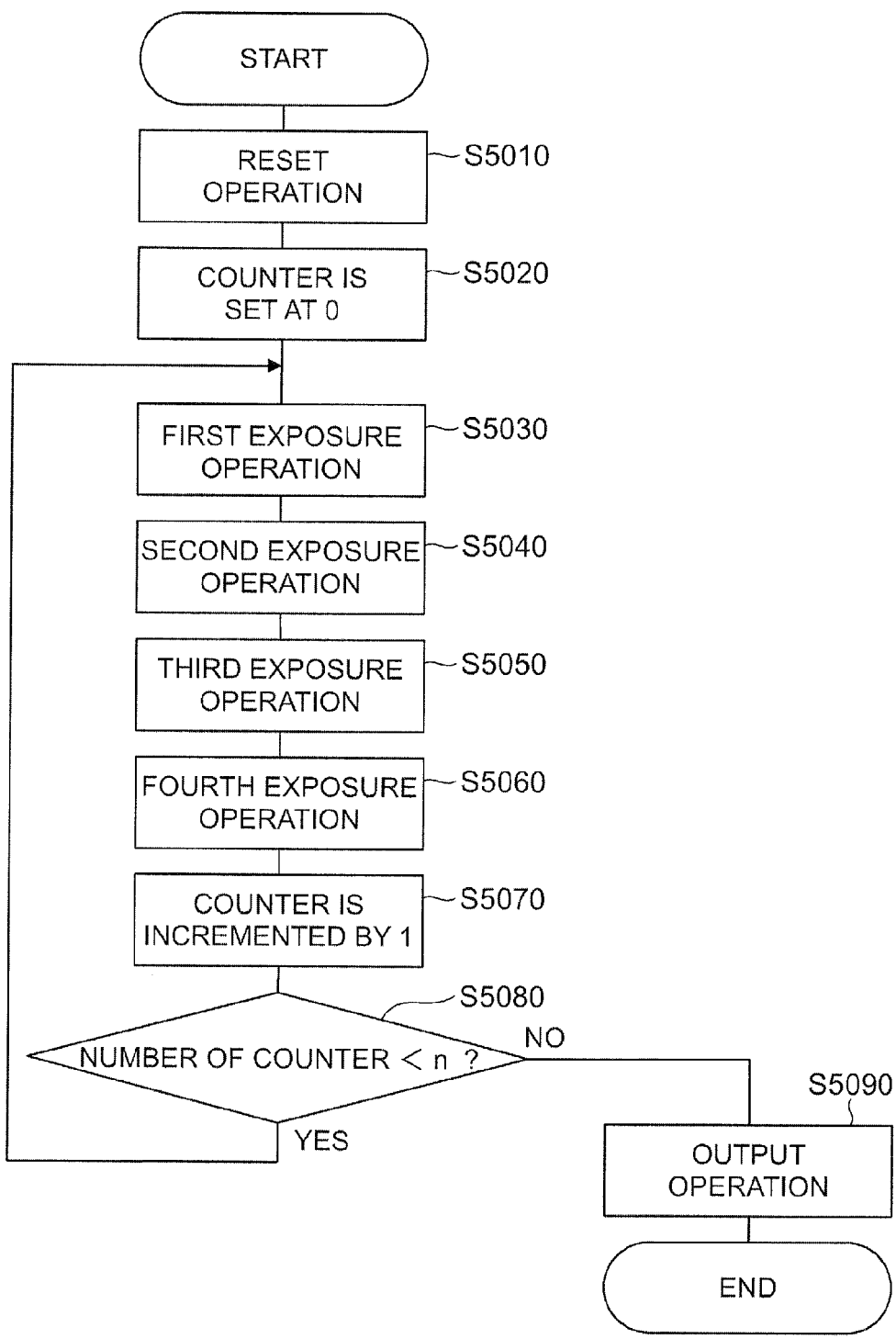
FIG. 5 is a flowchart which shows a typical operational procedure of the imaging control section of the imaging device according to the present embodiment.

FIG. 5 is a flowchart which shows a typical operational procedure of the imaging control section 105 of the imaging device according to the present embodiment.

In step S5010 of FIG. 5, the imaging control section 105 discharges charge stored in the four charge storage sections 10151, 10152, 10153 and 10154 by having the four reset gate sections RX1, RX2, RX3 and RX4 operate.

In step S5020 of FIG. 5, the imaging control section 105 sets a counter for counting the number of repeated operations at 0.

In steps S5030 to S5060 of FIG. 5, the imaging control section 105 controls the photosensitive section 101 in such a way that the first to fourth exposure operations are carried out by the photosensitive section 101. The first to fourth exposure operations will be described later. Amounts of charge collected in the charge transfer section 1013 through the first to fourth exposure operations are stored in the capacitors C1, C2, C3 and C4 through the transfer gate sections TX1, TX2, TX3 and TX4, respectively.

In step S5070 of FIG. 5, the imaging control section 105 increments the counter by 1.

In step S5080 of FIG. 5, the imaging control section 105 determines whether or not the counter shows a number less than n. If the counter shows a number which is less than n, the process returns to step S5030 to repeat the first to fourth exposure operations. If the counter shows a number which is equal to or greater than n, the process goes to S5090.

In step S5090 of FIG. 5, the imaging control section 105 controls the photosensitive section 101 and the difference output section 103 in such a way that output operation is performed.

Exposure operation and output operation will be described in detail with referring to the first to fifth examples.

Figure 6:
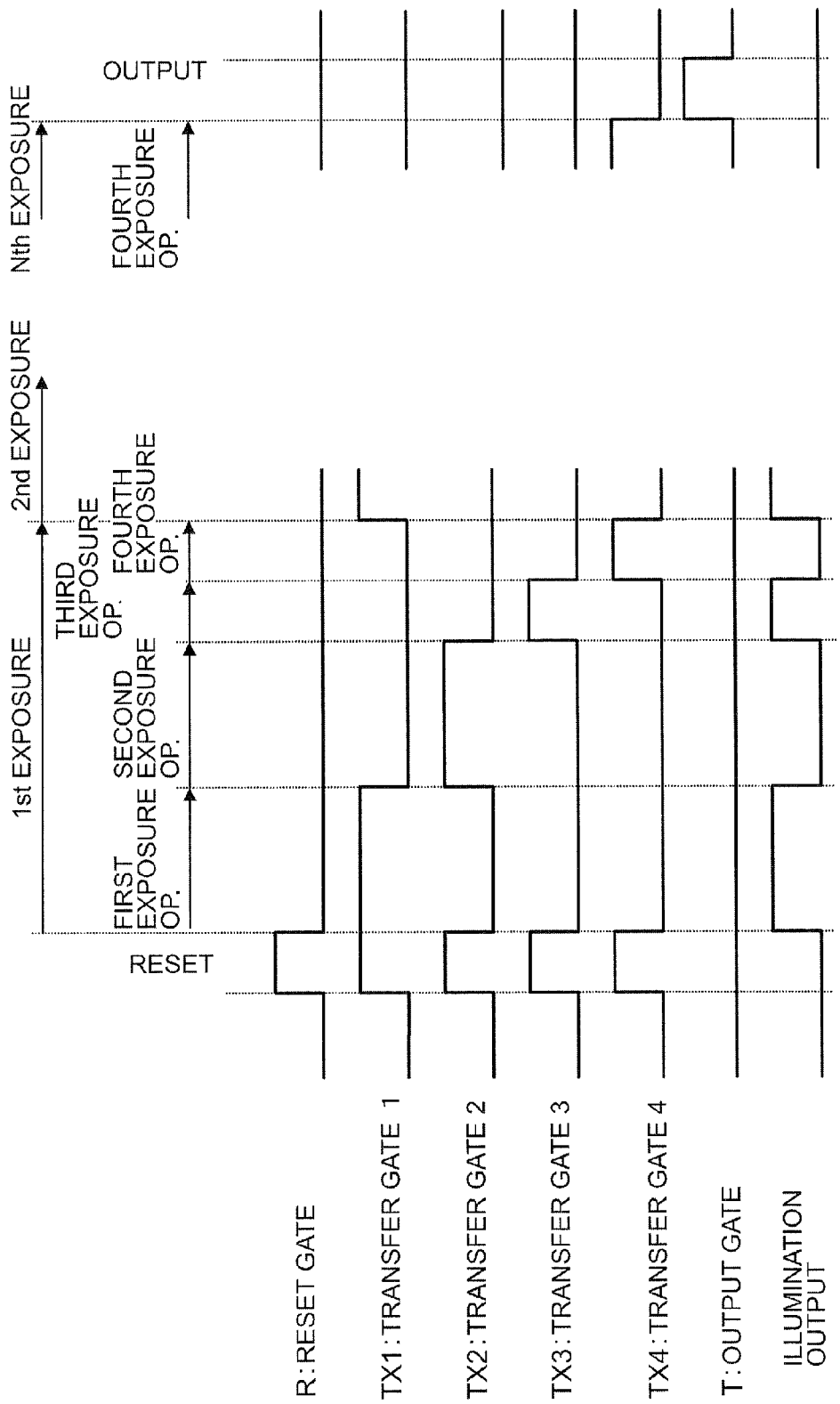
FIG. 6 is a timing chart of the first to fourth operations (steps S5030 to S5060 of FIG. 5) according to the first example.

FIG. 6 is a timing chart of the first to fourth operations (steps S5030 to S5060 of FIG. 5) according to the first example. Exposure time of the first and second exposure operations is relatively long while that of the third and fourth exposure operations is relatively short. During a period of exposure time of the first and third exposure operations, the object is illuminated by the illuminating means 107. In the first exposure operation, charge collected in the relatively long exposure time for an illuminated object is stored in the capacitor C1 through the transfer gate section TX1. In the second exposure operation, charge collected in the relatively long exposure time for an unilluminated object is stored in the capacitor C2 through the transfer gate section TX2. In the third exposure operation, charge collected in the relatively short exposure time for an illuminated object is stored in the capacitor C3 through the transfer gate section TX3. In the fourth exposure operation, charge collected in the relatively short exposure time for an unilluminated object is stored in the capacitor C4 through the transfer gate section TX4. Thus, different amounts of charge collected under different conditions are stored in the capacitors C1 to C4. The first to fourth exposure operations are repeated by n times.

By way of example, exposure time of the first and second exposure operations is 30 microseconds while that of the third and fourth exposure operations is 10 microseconds. Further, the number of repetition is 1000. In this case, a period of the first to fourth exposure operations is 80 microseconds. On the other hand, a total exposure time of the first and second exposure operations is 30 milliseconds while that of the third and fourth exposure operations is 10 milliseconds. Accordingly, without the repetition of the operations, a period of the first to fourth exposure operations would be 80 milliseconds. Without the repetition of the operations, time differences between time points at which respective exposure operations are carried out would be large, and therefore the image forming would tend to be affected by motion of the object. However, according to the present embodiment, the first to fourth exposure operations are repeated in a short period and amounts of charge are integrated by the capacitors C1 to C4, so that an image with a wide dynamic range can be formed without being affected by motion of a moving object.

In order to form an image with a wide dynamic range, exposure time of the first to fourth exposure operations should preferably be 10 to 100 microseconds and the number of repetition should preferably be 100 to 1000 from a practical standpoint.

Figure 7:
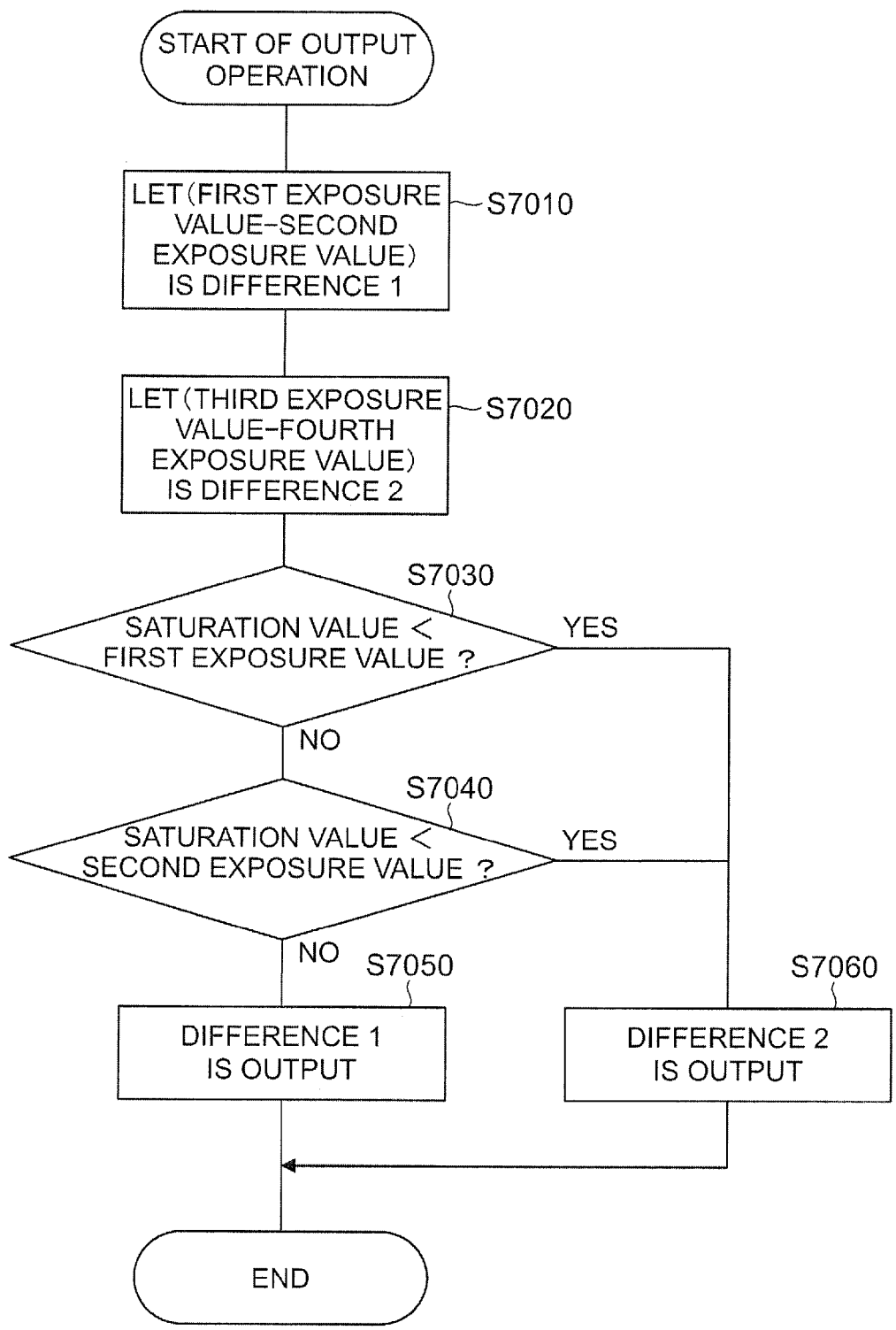
FIG. 7 is a flowchart showing the output operation (step S5090 of FIG. 5) of the first example.

FIG. 7 is a flowchart showing the output operation (step S5090 of FIG. 5) of the first example.

In step S7010 of FIG. 7, the difference output section 103 obtains a difference between a first exposure value and a second exposure value as difference 1. The first to fourth exposure values mean integral values of amounts of charge stored in the capacitors C1 to C4 thorough the first to fourth exposure operations, respectively.

In step S7020 of FIG. 7, the difference output section 103 obtains a difference between a third exposure value and a fourth exposure value as difference 2.

In step S7030 of FIG. 7, the difference output section 103 compares the first exposure value with the saturation value of the photosensitive section 101. If the first exposure value is greater than the saturation value, the process goes to step S7060. If the first exposure value is equal to or smaller than the saturation value, the process goes to step S7040.

In step S7040 of FIG. 7, the difference output section 103 compares the second exposure value with the saturation value of the photosensitive section 101. If the second exposure value is greater than the saturation value, the process goes to step S7060. If the second exposure value is equal to or smaller than the saturation value, the process goes to step S7050.

In step S7050 of FIG. 7, the difference output section 103 reads difference 1 as an output of the pixel unit 100.

In step S7060 of FIG. 7, the difference output section 103 reads difference 2 as an output of the pixel unit 100.

As described above, an output of the pixel unit 100 is changed according to values of the first to fourth exposure values, so that an image with a wide dynamic range can be formed.

Figure 8:
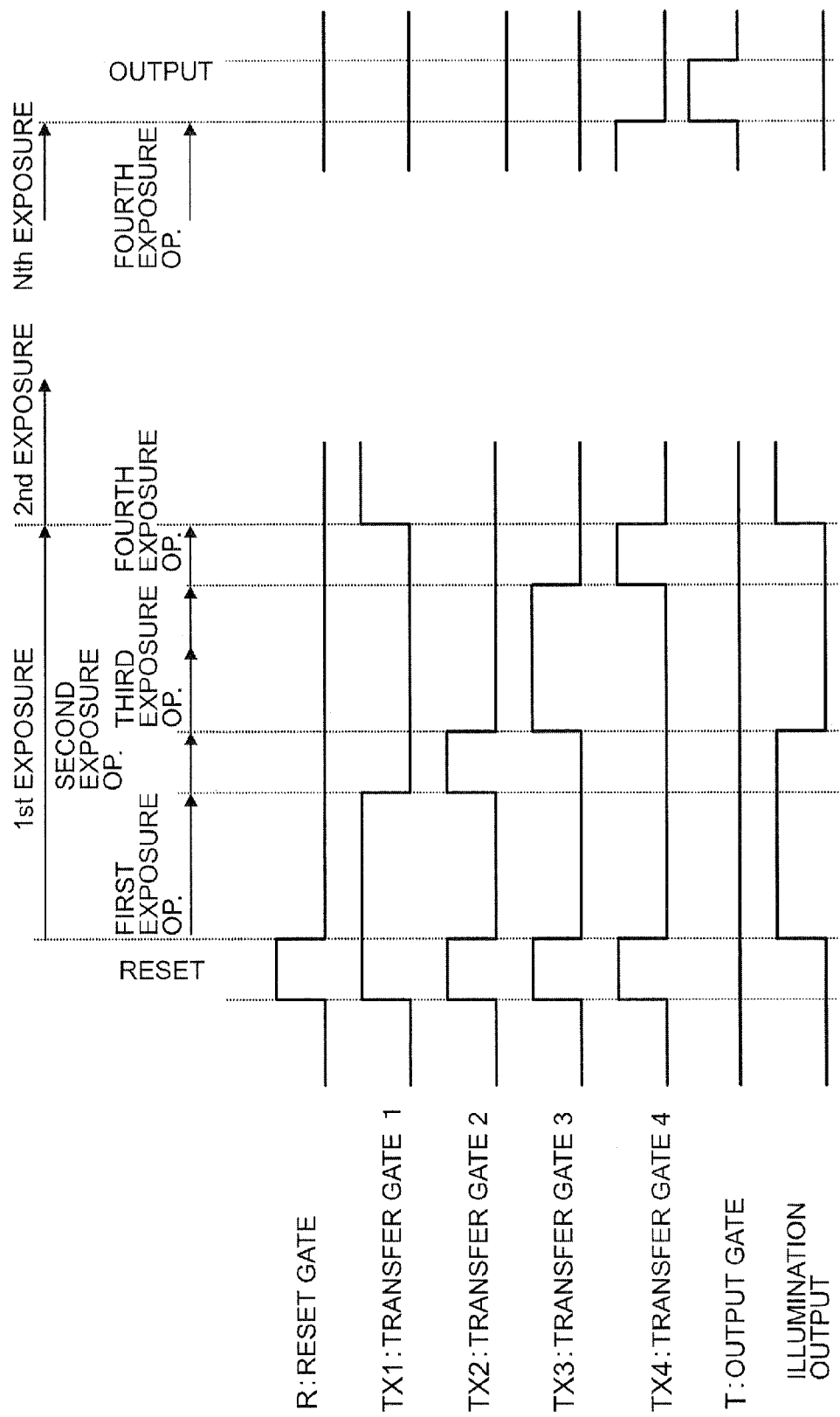
FIG. 8 is a timing chart of the first to fourth operations (steps S5030 to S5060 of FIG. 5) according to the second example.

FIG. 8 is a timing chart of the first to fourth operations (steps S5030 to S5060 of FIG. 5) according to the second example. Exposure time of the first and third exposure operations is relatively long while that of the second and fourth exposure operations is relatively short. During a period of exposure time of the first and second exposure operations, the object is illuminated by the illuminating means 107. In the first exposure operation, charge collected in the relatively long exposure time for an illuminated object is stored in the capacitor C1 through the transfer gate section TX1. In the second exposure operation, charge collected in the relatively short exposure time for an illuminated object is stored in the capacitor C2 through the transfer gate section TX2. In the third exposure operation, charge collected in the relatively long exposure time for an illuminated object is stored in the capacitor C3 through the transfer gate section TX3. In the fourth exposure operation, charge collected in the relatively short exposure time for an unilluminated object is stored in the capacitor C4 through the transfer gate section TX4. Thus, different amounts of charge collected under different conditions are stored in the capacitors C1 to C4. The first to fourth exposure operations are repeated by n times.

By way of example, exposure time of the first and third exposure operations is 30 microseconds while that of the second and fourth exposure operations is 10 microseconds. Further, the number of repetition is 1000. In this case, a period of the first to fourth exposure operations is 80 microseconds. On the other hand, a total exposure time of the first and third exposure operations is 30 milliseconds while that of the second and fourth exposure operations is 10 milliseconds. Accordingly, without the repetition of the operations, a period of the first to fourth exposure operations would be 80 milliseconds. Without the repetition of the operations, time differences between time points at which respective exposure operations are carried out would be large, and therefore the image forming would tend to be affected by motion of the object. However, according to the present embodiment, the first to fourth exposure operations are repeated in a short period and amounts of charge are integrated by the capacitors C1 to C4, so that an image with a wide dynamic range can be formed without being affected by motion of a moving object.

When compared with the timing chart of the first example shown in FIG. 6, the number of times of tuning on and off of the illuminating means 107 can be reduced in the present example.

Figure 9:
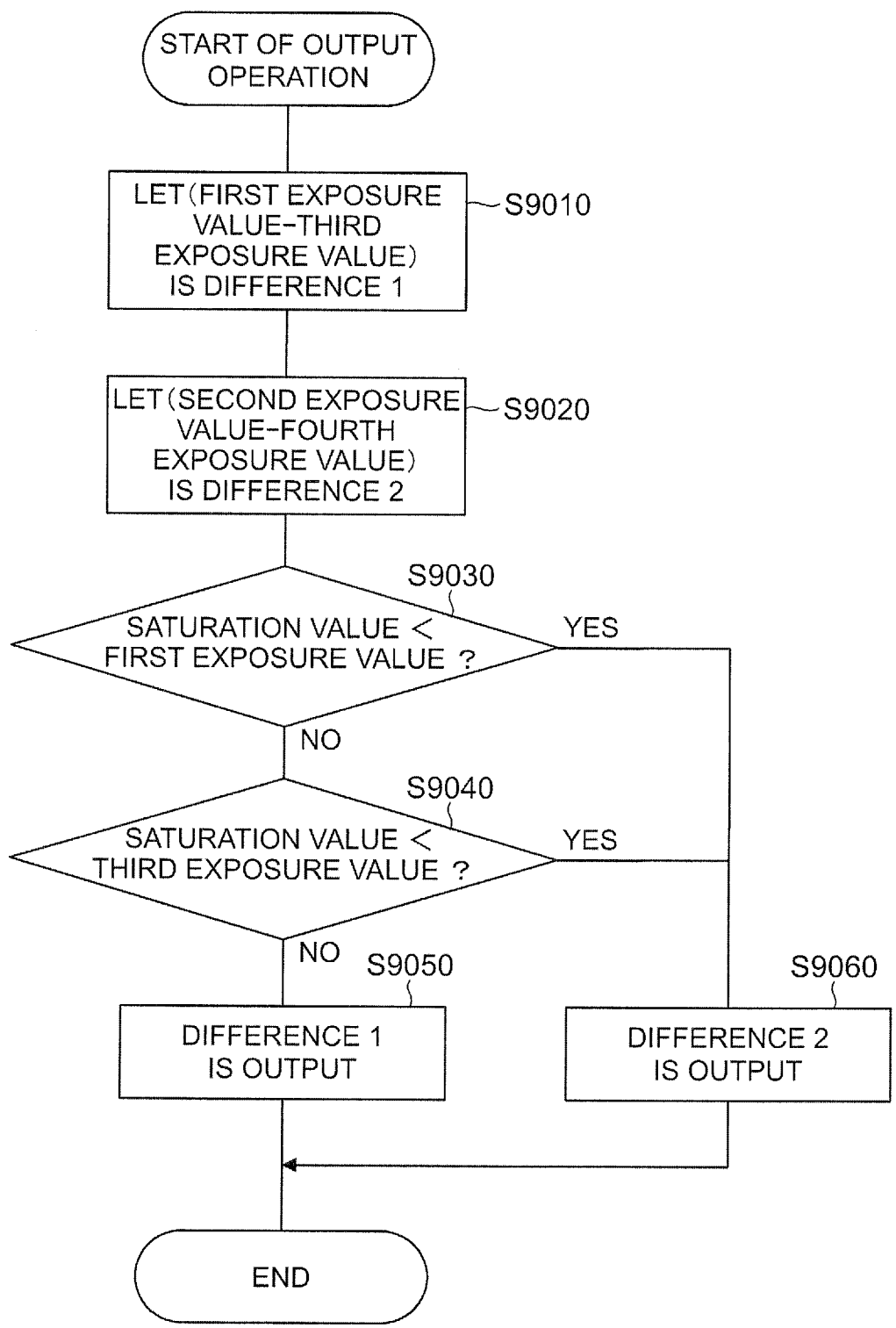
FIG. 9 is a flowchart showing the output operation (step S5090 of FIG. 5) of the second example.

FIG. 9 is a flowchart showing the output operation (step S5090 of FIG. 5) of the second example.

In step S9010 of FIG. 9, the difference output section 103 obtains a difference between a first exposure value and a third exposure value as difference 1. The first to fourth exposure values mean integral values of amounts of charge stored in the capacitors C1 to C4 thorough the first to fourth exposure operations, respectively.

In step S9020 of FIG. 9, the difference output section 103 obtains a difference between a second exposure value and a fourth exposure value as difference 2.

In step S9030 of FIG. 9, the difference output section 103 compares the first exposure value with the saturation value of the photosensitive section 101. If the first exposure value is greater than the saturation value, the process goes to step S9060. If the first exposure value is equal to or smaller than the saturation value, the process goes to step S9040.

In step S9040 of FIG. 9, the difference output section 103 compares the third exposure value with the saturation value of the photosensitive section 101. If the third exposure value is greater than the saturation value, the process goes to step S9060. If the third exposure value is equal to or smaller than the saturation value, the process goes to step S9050.

In step S9050 of FIG. 9, the difference output section 103 reads difference 1 as an output of the pixel unit 100.

In step S9060 of FIG. 9, the difference output section 103 reads difference 2 as an output of the pixel unit 100.

As described above, an output of the pixel unit 100 is changed according to values of the first to fourth exposure values, so that an image with a wide dynamic range can be formed.

Figure 10:
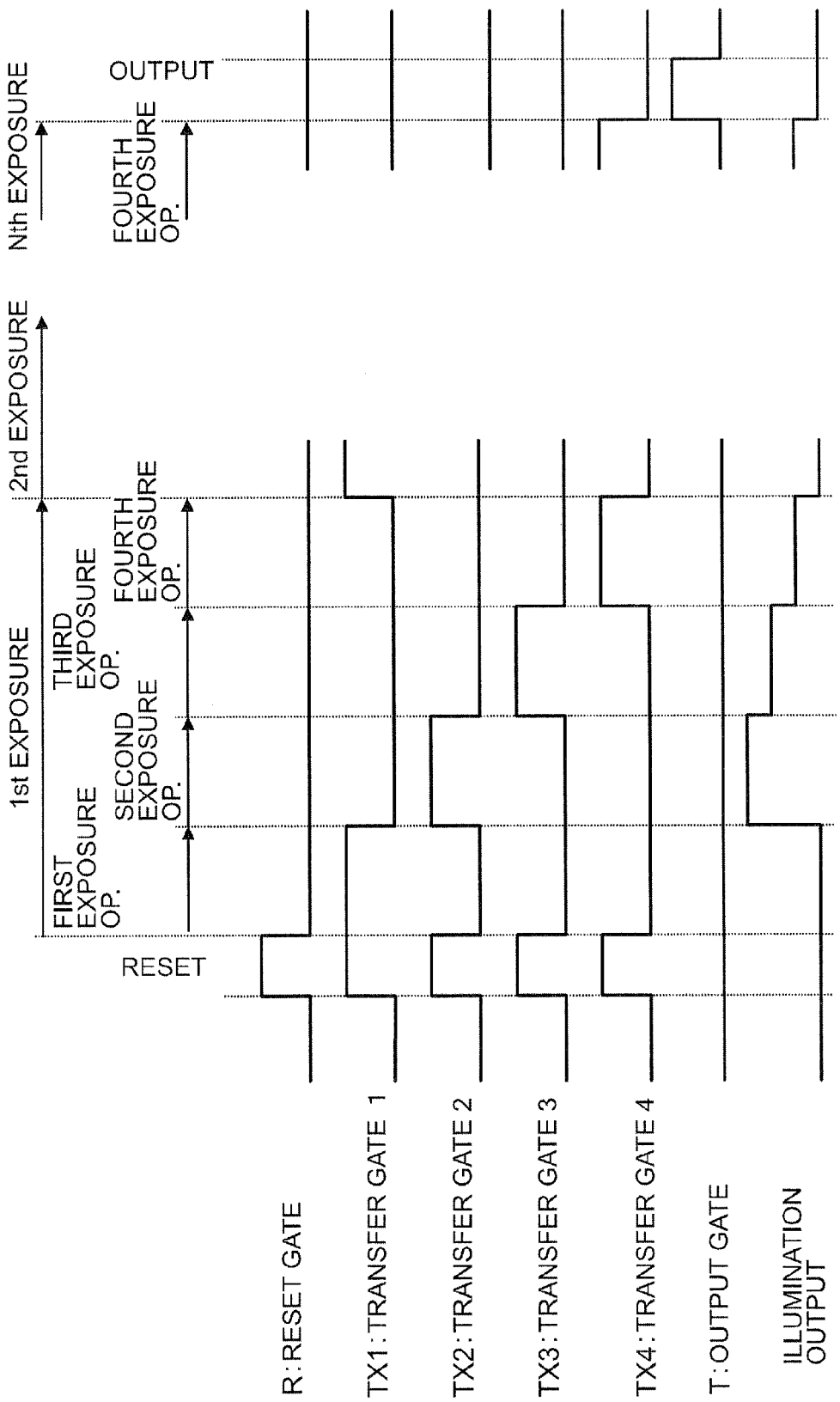
FIG. 10 is a timing chart of the first to fourth operations (steps S5030 to S5060 of FIG. 5) according to the third example.

FIG. 10 is a timing chart of the first to fourth operations (steps S5030 to S5060 of FIG. 5) according to the third example. In the present example, the first to fourth exposure operations are equal in exposure time while illuminating conditions during exposure time periods of the first to fourth exposure operations are different. Specifically, the image control section 105 controls intensity of illumination of the illuminating means 107. During exposure time periods of the second to fourth exposure operations, the illuminating means 107 illuminates the object. Intensity of illumination in exposure time of the second exposure operation is the largest and that of the third exposure operation is the second largest. Intensity of illumination in exposure time of the fourth exposure operation is smaller than those of the second and third exposure operations. In exposure time of the first exposure operation, the object is not illuminated. That is, intensity of illumination in exposure time of the first exposure operation is 0. Thus, different amounts of charge collected under different illuminating conditions by the first to fourth exposure operations are stored in the capacitors C1 to C4. The first to fourth exposure operations are repeated by n times.

Figure 11:
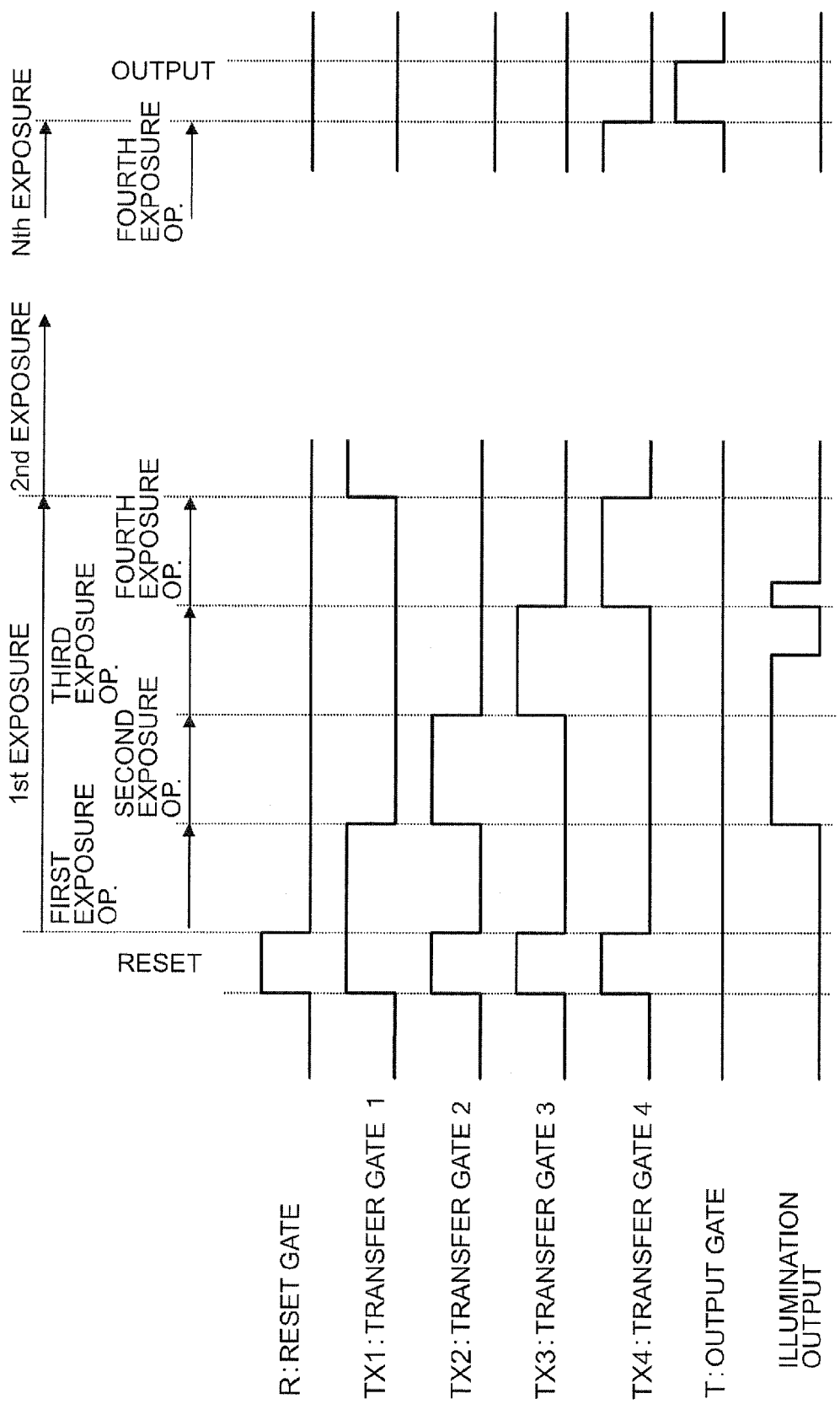
FIG. 11 is a timing chart of the first to fourth operations (steps S5030 to S5060 of FIG. 5) according to the fourth example.

FIG. 11 is a timing chart of the first to fourth operations (steps S5030 to S5060 of FIG. 5) according to the fourth example. In the present example, the first to fourth exposure operations are equal in exposure time while illuminating conditions during exposure time periods of the first to fourth exposure operations are different. Specifically, the image control section 105 controls the illuminating means 107 in such a way that intensity of illumination is kept constant and a pulse width which determines illumination time is changed. During exposure time periods of the second to fourth exposure operations, the illuminating means 107 illuminates the object. Illumination time in exposure time of the second exposure operation is the largest and that of the third exposure operation is the second largest. Illumination time in exposure time of the fourth exposure operation is smaller than those of the second and third exposure operations. In exposure time of the first exposure operation, the object is not illuminated. That is, intensity of illumination in exposure time of the first exposure operation is 0. Thus, different amounts of charge collected under different illuminating conditions by the first to fourth exposure operations are stored in the capacitors C1 to C4. The first to fourth exposure operations are repeated by n times.

Figure 12:
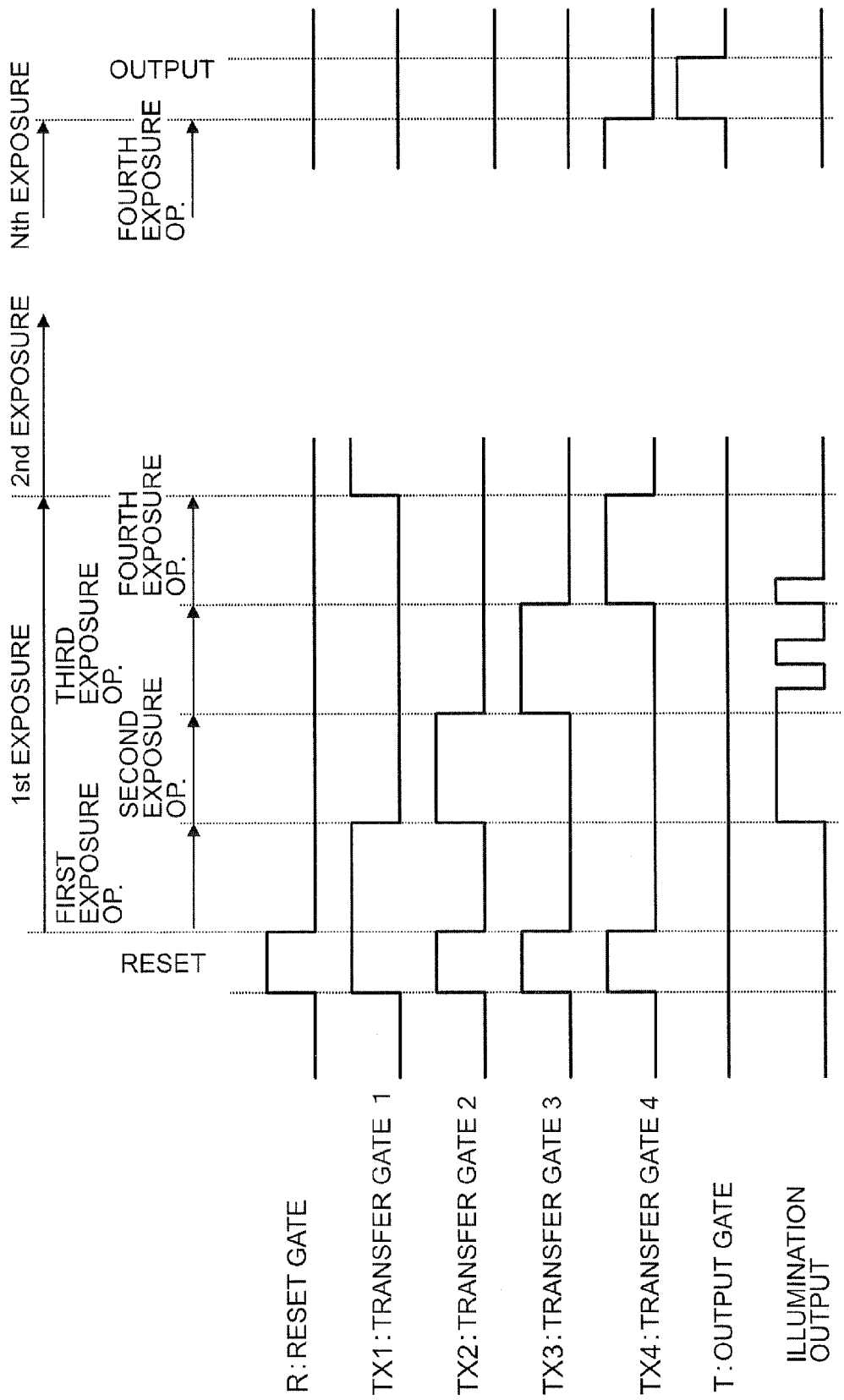
FIG. 12 is a timing chart of the first to fourth operations (steps S5030 to S5060 of FIG. 5) according to the fifth example.

FIG. 12 is a timing chart of the first to fourth operations (steps S5030 to S5060 of FIG. 5) according to the fifth example. In the present example, the first to fourth exposure operations are equal in exposure time while illuminating conditions during exposure time periods of the first to fourth exposure operations are different. Specifically, the image control section 105 controls the illuminating means 107 in such a way that intensity of illumination and a pulse width which determines illumination time are kept constant and the number of pulses are changed. During exposure time periods of the second to fourth exposure operations, the illuminating means 107 illuminates the object. Illumination time (the number of pulses which determines illumination time) in exposure time of the second exposure operation is the largest and that of the third exposure operation is the second largest. Illumination time in exposure time of the fourth exposure operation is smaller than those of the second and third exposure operations. In exposure time of the first exposure operation, the object is not illuminated. That is, intensity of illumination in exposure time of the first exposure operation is 0. Thus, different amounts of charge collected under different illuminating conditions by the first to fourth exposure operations are stored in the capacitors C1 to C4. The first to fourth exposure operations are repeated by n times.

By way of example, in the third to fifth examples, exposure time of the first to fourth exposure operations is 30 microseconds. Further, the number of repetition is 1000. In this case, a period of the first to fourth exposure operations is 120 microseconds. Accordingly, without the repetition of the operations, a period of the first to fourth exposure operations would be 120 milliseconds. Without the repetition of the operations, time differences between time points at which respective exposure operations are carried out would be large, and therefore the image forming would tend to be affected by motion of the object. However, according to the present embodiment, the first to fourth exposure operations are repeated in a short period and amounts of charge are integrated by the capacitors C1 to C4, so that an image with a wide dynamic range can be formed without being affected by motion of a moving object.

Figure 13:
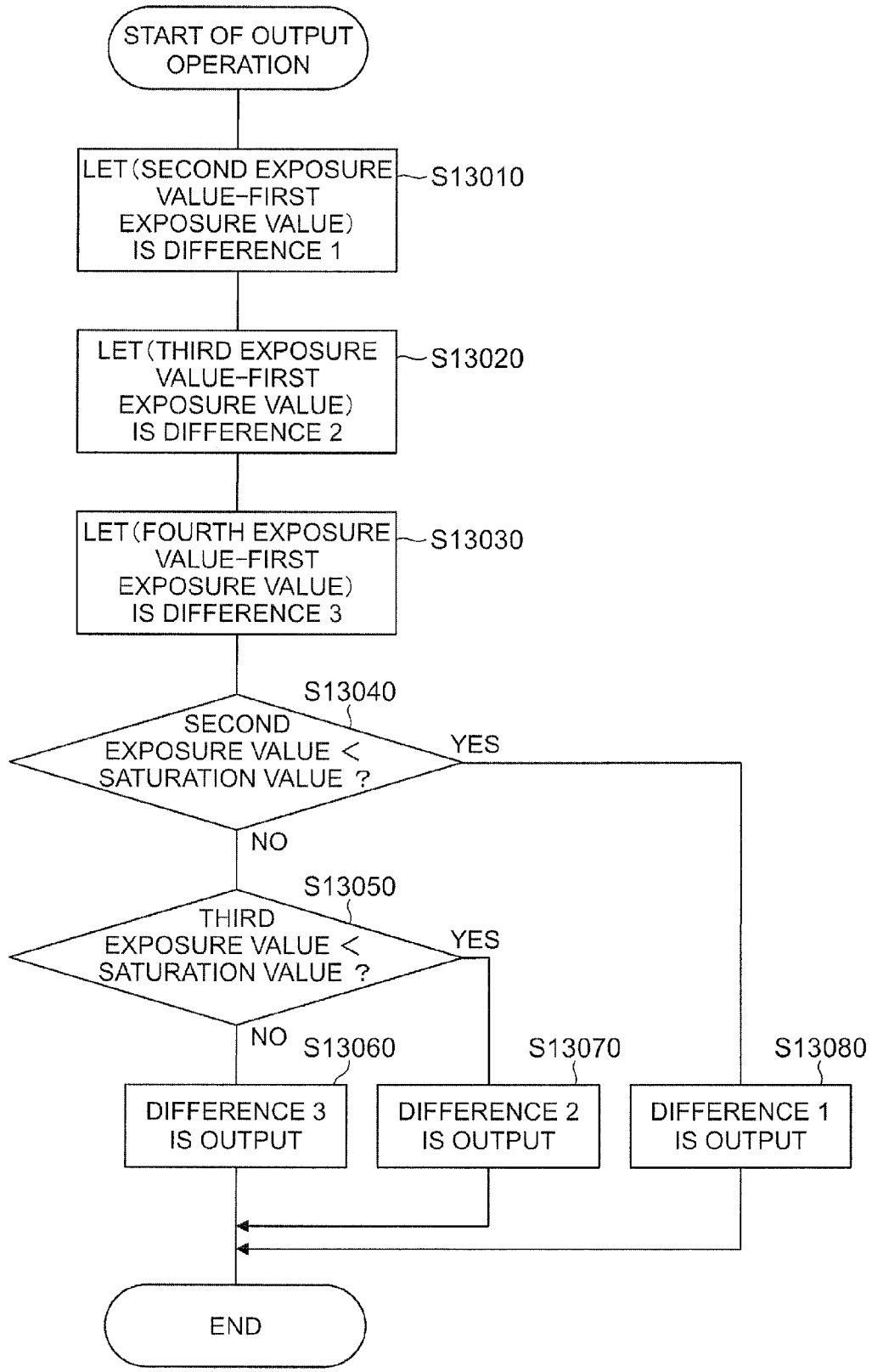
FIG. 13 is a flowchart showing the output operation (step S5090 of FIG. 5) of the third to fifth examples.

FIG. 13 is a flowchart showing the output operation (step S5090 of FIG. 5) of the third to fifth examples.

In step S13010 of FIG. 13, the difference output section 103 obtains a difference between a second exposure value and a first exposure value as difference 1. The first to fourth exposure values mean integral values of amounts of charge stored in the capacitors C1 to C4 thorough the first to fourth exposure operations, respectively.

In step S13020 of FIG. 13, the difference output section 103 obtains a difference between a third exposure value and the first exposure value as difference 2.

In step S13030 of FIG. 13, the difference output section 103 obtains a difference between a fourth exposure value and the first exposure value as difference 3.

In step S13040 of FIG. 13, the difference output section 103 compares the second exposure value with the saturation value of the photosensitive section 101. If the second exposure value is smaller than the saturation value, the process goes to step S13080. If the second exposure value is equal to or greater than the saturation value, the process goes to step S13050.

In step S13050 of FIG. 13, the difference output section 103 compares the third exposure value with the saturation value of the photosensitive section 101. If the third exposure value is smaller than the saturation value, the process goes to step S13070. If the third exposure value is equal to or greater than the saturation value, the process goes to step S13060.

In step S13060 of FIG. 13, the difference output section 103 reads difference 3 as an output of the pixel unit 100.

In step S13070 of FIG. 13, the difference output section 103 reads difference 2 as an output of the pixel unit 100.

In step S13080 of FIG. 13, the difference output section 103 reads difference 1 as an output of the pixel unit 100.

As described above, an output of the pixel unit 100 is changed according to values of the first to fourth exposure values, so that an image with a wide dynamic range can be formed.

In the first to fifth examples described above, exposure time or intensity of illumination is changed to change an exposure value (a voltage value of the capacitor). Alternatively, a charge capacity of the capacitor can be changed to change a voltage value (an output) of the capacitor.

Figure 14:
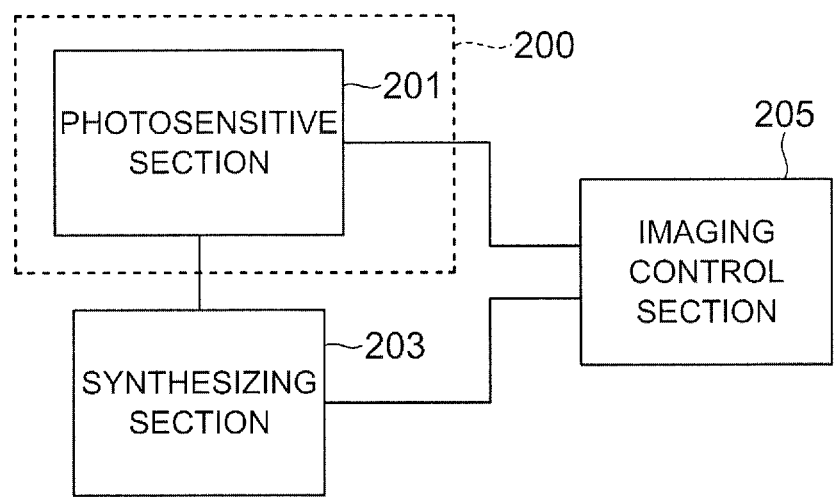
FIG. 14 shows a configuration of an imaging device according to the second embodiment of the present invention.

FIG. 14 shows a configuration of an imaging device according to the second embodiment of the present invention. The imaging device includes a pixel unit 200 including a photosensitive section 201, a synthesizing section 203 and an imaging control section 205. The imaging control section 205 controls the photosensitive section in such a way that the photosensitive section 201 of the pixel unit 200 forms a plurality of outputs under different conditions. The photosensitive section 201 of the pixel unit 200 forms a plurality of outputs under different conditions and the synthesizing section 203 selects appropriate outputs from the plurality of outputs to form a synthetic image. Thus, an image with a wide dynamic range is formed using outputs of the pixel unit 200. Construction and function of each component of the imaging device will be described in detail later.

FIG. 2 shows a configuration of an array of the pixel units 100. Like conventional pixel arrays, outputs of the array of the pixel units 100 are scanned by a circuit for vertical scanning 111 and a circuit for horizontal scanning 113 and then read one after another by a readout circuit 115. The synthesizing section 203 included in the readout circuit 115 selects a plurality of outputs from the outputs of each pixel unit 100 and synthesize the selected outputs to form an image with a wide dynamic range.

Figure 15:
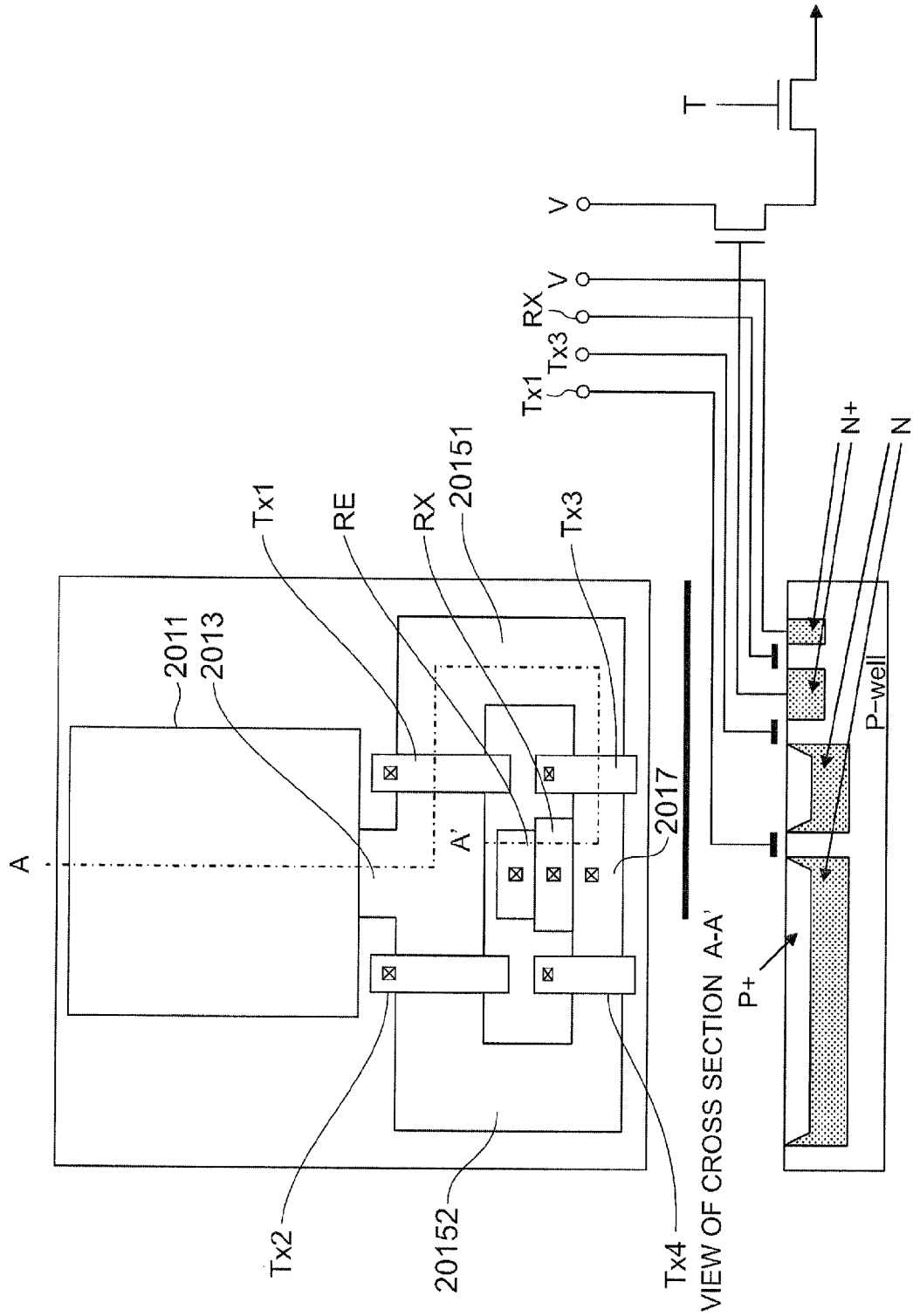
FIG. 15 shows a configuration of the photosensitive section of the pixel unit according to the present embodiment.

FIG. 15 shows a configuration of the photosensitive section 201 of the pixel unit 200 according to the present embodiment. The photosensitive section 201 is provided with a photoelectric converting section 2011, a charge collecting section 2013, two transfer gate sections Tx1 and Tx2, two charge storage sections 20151 and 20152, two readout transfer gate sections Tx3 and Tx4, a readout charge storage section 2017, a reset gate section RX and an electrode RE. FIG. 15 also shows cross section A-A' of the photosensitive section 201.

Charge generated by the photoelectric converting section 2011 is collected in the charge collecting section 2013 and then transferred to the two charge storage sections 20151 and 20152 by the two transfer gate sections Tx1 and Tx2. The imaging control section 205 not shown in FIG. 15 controls operation of the two transfer gate sections Tx1 and Tx2 in such a way that amounts of charge are collected in the charge collecting section 2013 under different conditions (exposure time and the like) and transferred to the two charge storage sections 20151 and 20152. The operation described above will be described in detail later. Amounts of charge stored in the two charge storage sections 20151 and 20152 are transferred respectively through the two readout transfer gate sections Tx3 and Tx4 and stored in a readout charge storage section 2017. Charge stored in the readout charge storage section 2017 is read by a readout gate T. The reset gate section RX and electrode RE are used to discharge charge stored in the readout charge storage section 2017. The imaging control section 205 not shown in FIG. 15 operates the reset gate section RX to discharge charge stored in the readout charge storage section 2017. In the present embodiment, the readout section is shared so that correction of variation in performance of amplifiers becomes unnecessary.

Figure 16:
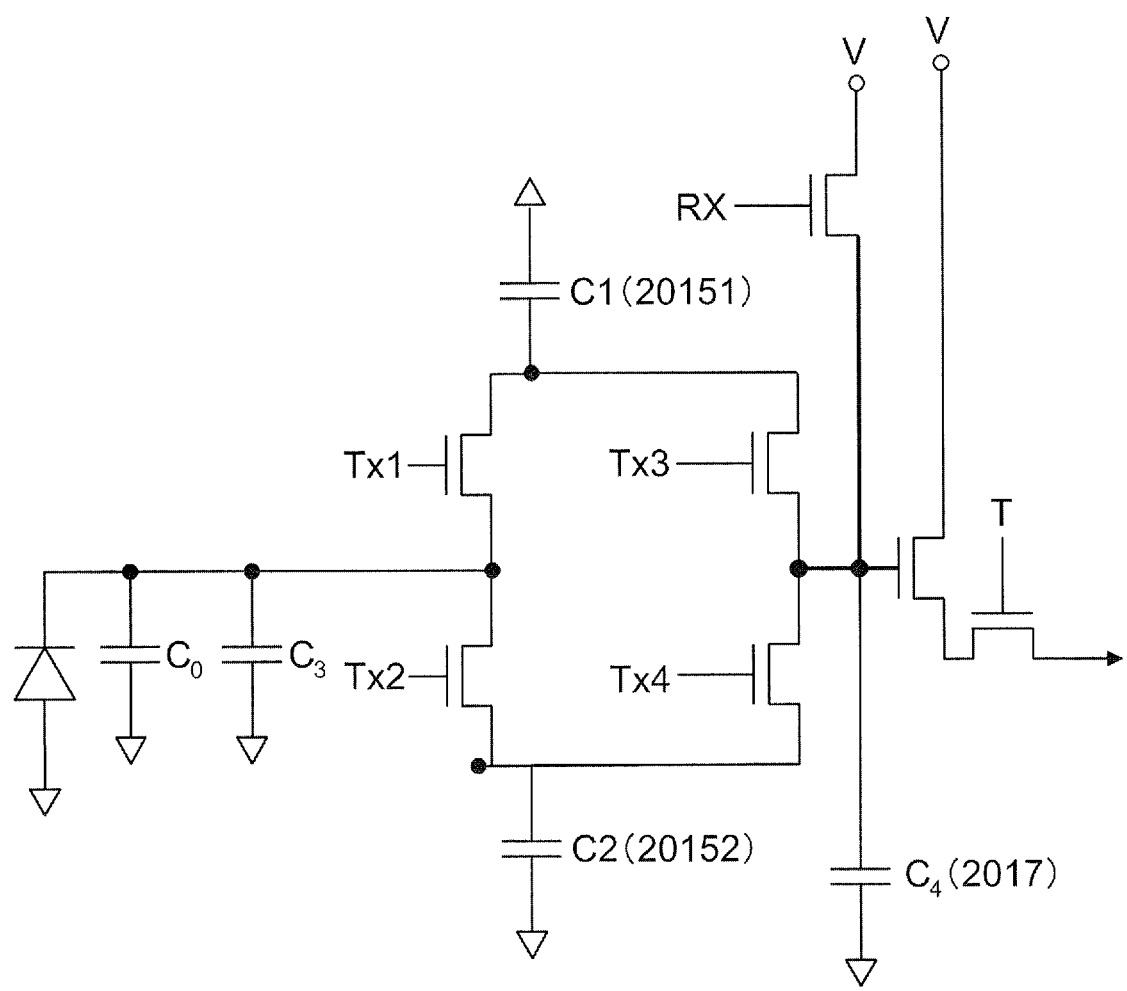
FIG. 16 is a circuit diagram showing function of the photosensitive section of the pixel unit 200 according to the present embodiment.

FIG. 16 is a circuit diagram showing function of the photosensitive section 201 of the pixel unit 200 according to the present embodiment. The two charge storage sections 20151 and 20152 are represented as capacitors C1 and C2. In the present embodiment, the imaging control section 205 controls operation of the transfer gate sections Tx1 and Tx2 in such a way that charge is collected in the charge transfer section 2013 and stored in the capacitors C1 and C2, respectively under different conditions (exposure time and the like) and the operation is performed repeatedly. Accordingly, different amounts of charge collected under different conditions (exposure time and the like) are integrated in the capacitors C1 and C2 by the repetition. Charge stored in the capacitors C1 and C2 is read by the readout transfer gate section Tx3 and the readout gate T or the readout transfer gate section Tx4 and the readout gate T.

Figure 17:
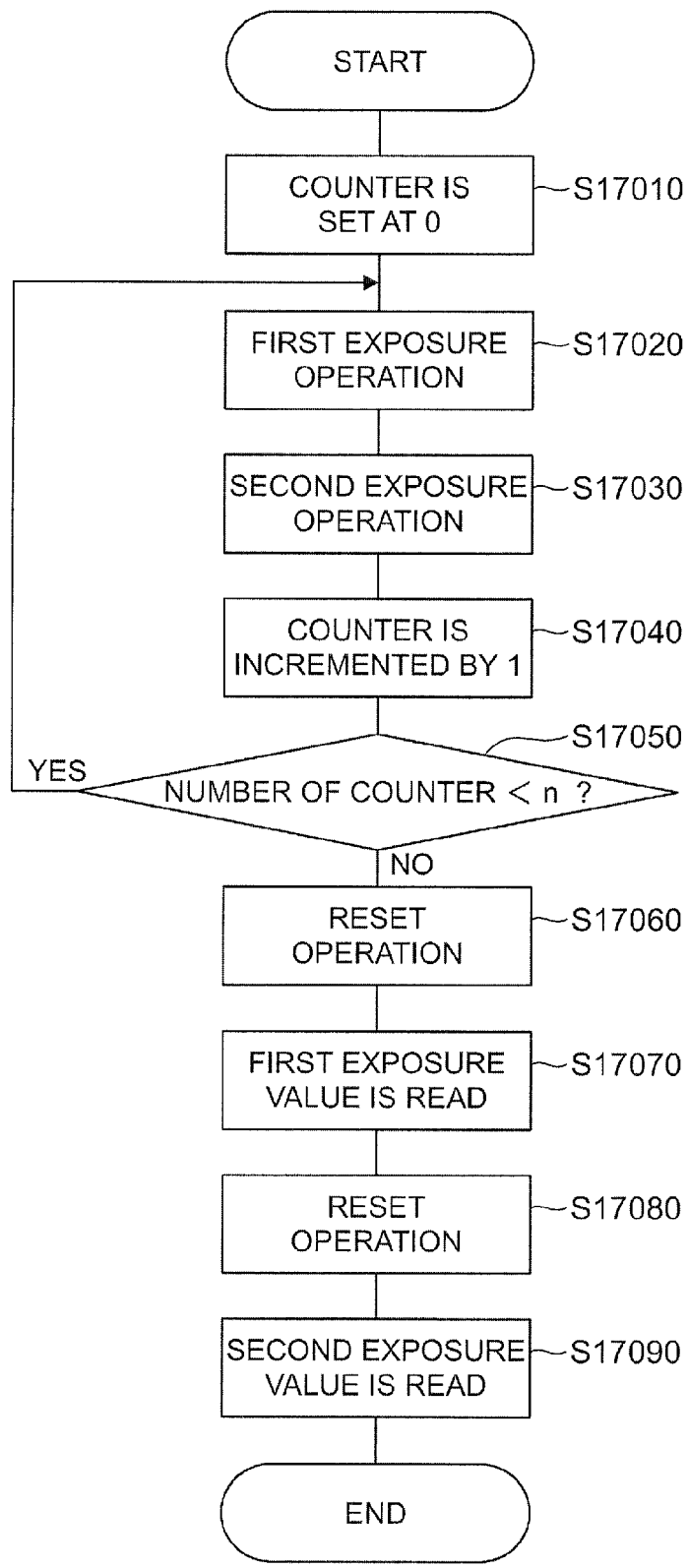
FIG. 17 is a flowchart which shows a typical operational procedure of the imaging control section of the imaging device according to the present embodiment.

FIG. 17 is a flowchart which shows a typical operational procedure of the imaging control section 205 of the imaging device according to the present embodiment.

In step S17010 of FIG. 17, the imaging control section 205 sets a counter for counting the number of repeated operations at 0.

In steps S17020 to S17030 of FIG. 17, the imaging control section 205 controls the photosensitive section 201 in such a way that the first and second exposure operations are carried out by the photosensitive section 201. The first and second exposure operations will be described later. Amounts of charge collected in the charge collecting section 2013 through the first and second exposure operations are stored in the capacitors C1 and C2 through the transfer gate sections Tx1 and Tx2, respectively.

In step S17040 of FIG. 17, the imaging control section 205 increments the counter by 1.

In step S17050 of FIG. 17, the imaging control section 205 determines whether or not the counter shows a number less than n. If the counter shows a number which is less than n, the process returns to step S17020 to repeat the first and second exposure operations. If the counter shows a number which is equal to or greater than n, the process goes to S17060.

In step S17060 of FIG. 17, the imaging control section 205 has the reset gate section RX operate to discharge charge stored in the readout charge storage section 2017.

In step S17070 of FIG. 17, the imaging control section 205 controls the readout transfer gate section Tx3 in such a way that charge stored in the charge storage section 20151 is stored in the readout charge storage section 2017. Charge stored in the readout charge storage section 2017 is read by the readout gate T.

In step S17080 of FIG. 17, the imaging control section 205 has the reset gate section RX operate to discharge charge stored in the readout charge storage section 2017.

In step S17090 of FIG. 17, the imaging control section 205 controls the readout transfer gate section Tx4 in such a way that charge stored in the charge storage section 20152 is stored in the readout charge storage section 2017. Charge stored in the readout charge storage section 2017 is read by the readout gate T.

Exposure operation and output operation will be described in detail with referring to an example.

Figure 18:
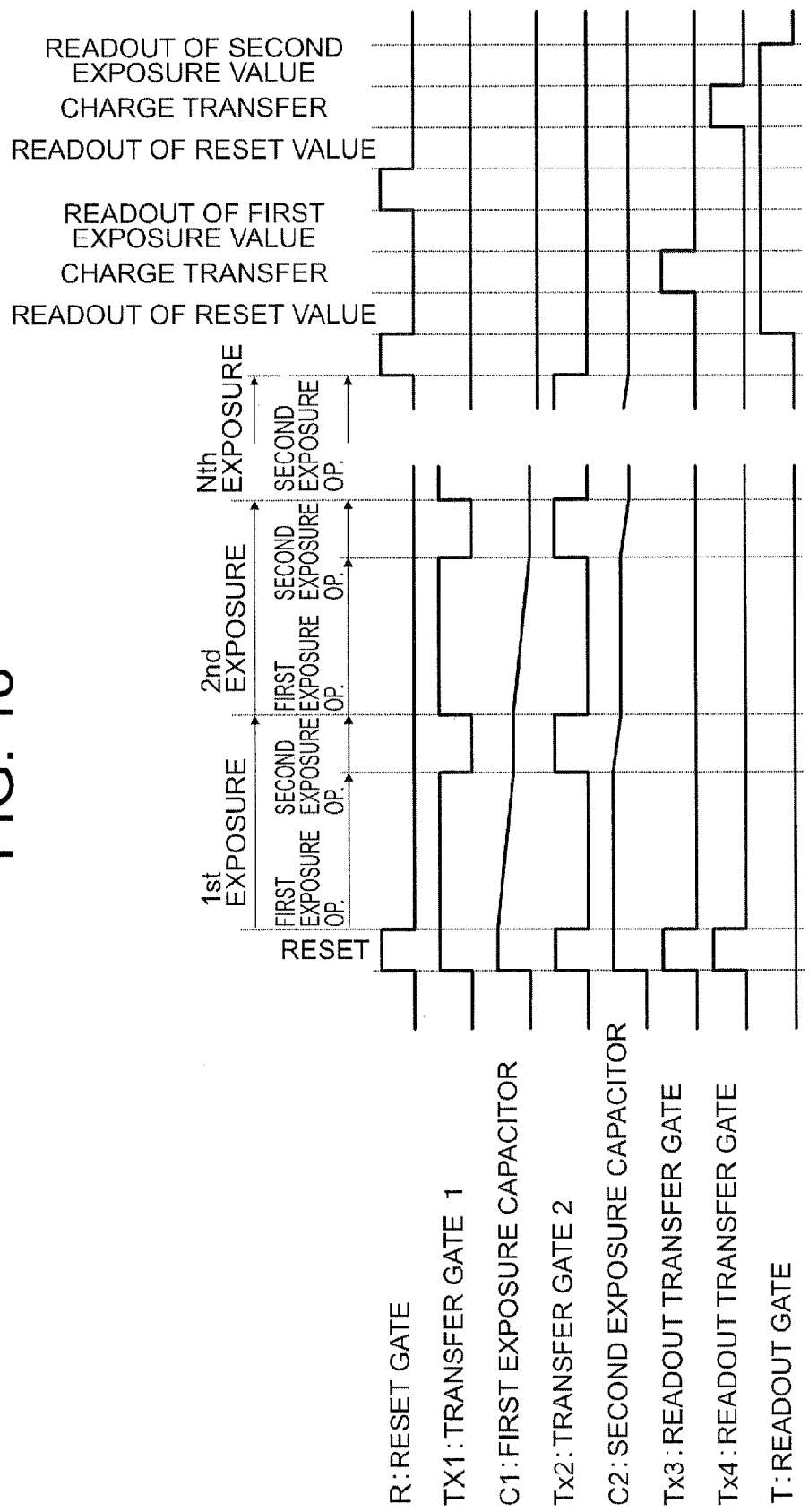
FIG. 18 is a timing chart of the first and second operations (steps S17020 to S17030 of FIG. 17) and output operations (steps S17060 to S17090 of FIG. 17) according to the example.

FIG. 18 is a timing chart of the first and second operations (steps S17020 to S17030 of FIG. 17) and output operations (steps S17060 to S17090 of FIG. 17) according to the example. Exposure time of the first exposure operation is relatively long while that of the second exposure operation is relatively short. In the first exposure operation, charge collected in the relatively long exposure time is stored in the capacitor C1 through the transfer gate section Tx1. In the second exposure operation, charge collected in the relatively short exposure time is stored in the capacitor C2 through the transfer gate section Tx2. Thus, different amounts of charge collected under different conditions are stored in the capacitors C1 and C2. The first and second exposure operations are repeated by n times.

By way of example, exposure time of the first exposure operation is 30 microseconds while that of the second exposure operation is 10 microseconds. Further, the number of repetition is 1000. In this case, a period of the first and second exposure operations is 40 microseconds. On the other hand, a total exposure time of the first exposure operation is 30 milliseconds while that of the second exposure operation is 10 milliseconds. Accordingly, without the repetition of the operations, a period of the first to second exposure operations would be 40 milliseconds. Without the repetition of the operations, time differences between time points at which respective exposure operations are carried out would be large, and therefore the image forming would tend to be affected by motion of the object. However, according to the present embodiment, the first and second exposure operations are repeated in the short period and amounts of charge are integrated by the capacitors C1 to C2 so that an image with a wide dynamic range can be formed without being affected by motion of a moving object.

The image controlling section 205 sends a reset pulse to the reset gate section RX and has the reset gate section RX operate to discharge charge stored in the readout charge storage section 2017.

The image controlling section 205 sends a charge transfer pulse to the readout transfer gate section Tx3 and has the readout transfer gate section Tx3 operate to transfer charge stored in the charge storage section 20151 to the readout charge storage section 2017, from which the charge is read by the readout gate T.

The image controlling section 205 sends a reset pulse to the reset gate section RX and has the reset gate section RX operate to discharge charge stored in the readout charge storage section 2017.

The image controlling section 205 sends a charge transfer pulse to the readout transfer gate section Tx4 and has the readout transfer gate section Tx4 operate to transfer charge stored in the charge storage section 20152 to the readout charge storage section 2017, from which the charge is read by the readout gate T.

The synthesizing section 203 selects outputs under appropriate conditions from outputs of the first exposure operation and those of the second exposure operation to form a synthetic image.

The pixel will be described further in detail below.

Figure 19A:
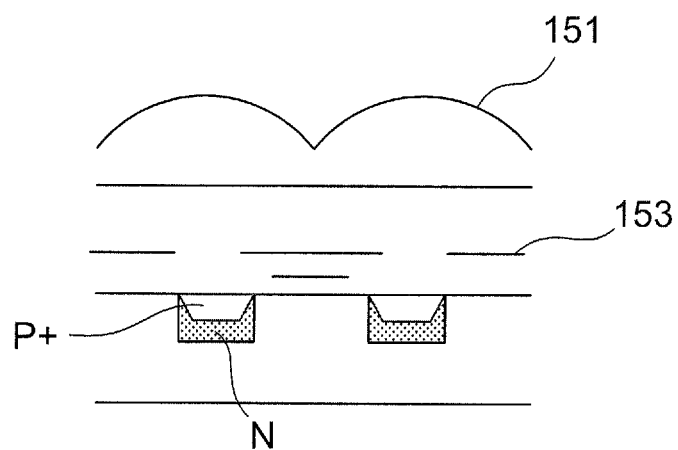
FIGS. 19A to 19C further illustrate the pixel shown in FIG. 3.
Figure 19B:
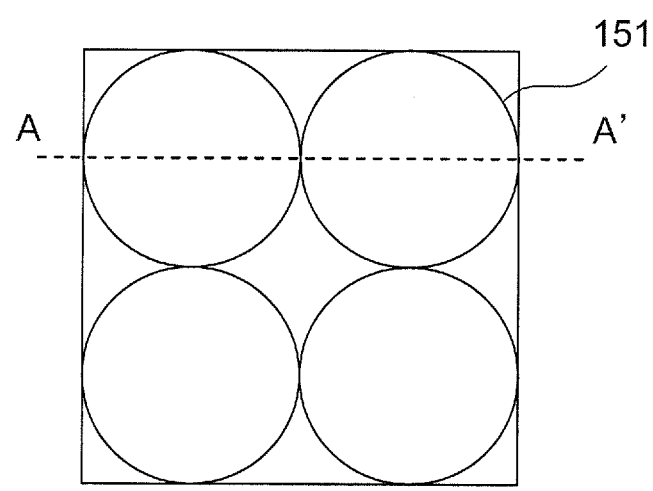
Figure 19C:
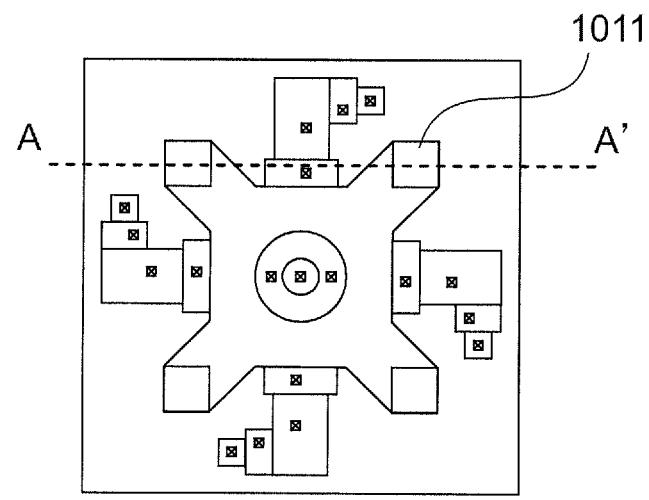

FIGS. 19A to 19C further illustrate the pixel shown in FIG. 3. As shown in FIG. 19B and FIG. 19C, the photosensitive section of the pixel is provided with four micro-lenses 151 for the four photoelectric converting sections 1011. The photosensitive section of the pixel will be hereinafter referred to merely as the pixel. FIG. 19A shows a cross section A-A', which is indicated in FIG. 19B and FIG. 19C. Regions except for the photoelectric converting sections 1011 on the surface of the pixel are covered with light shielding films 153.

Figure 20A:
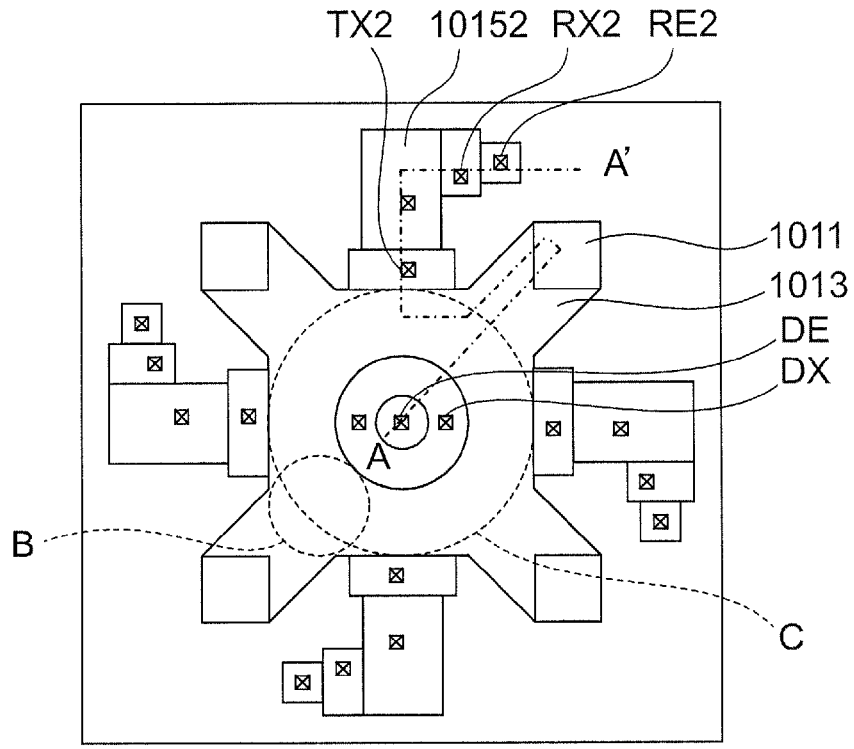
FIGS. 20A and 20B illustrate a configuration of the pixel shown in FIG. 3 in detail.
Figure 20B:
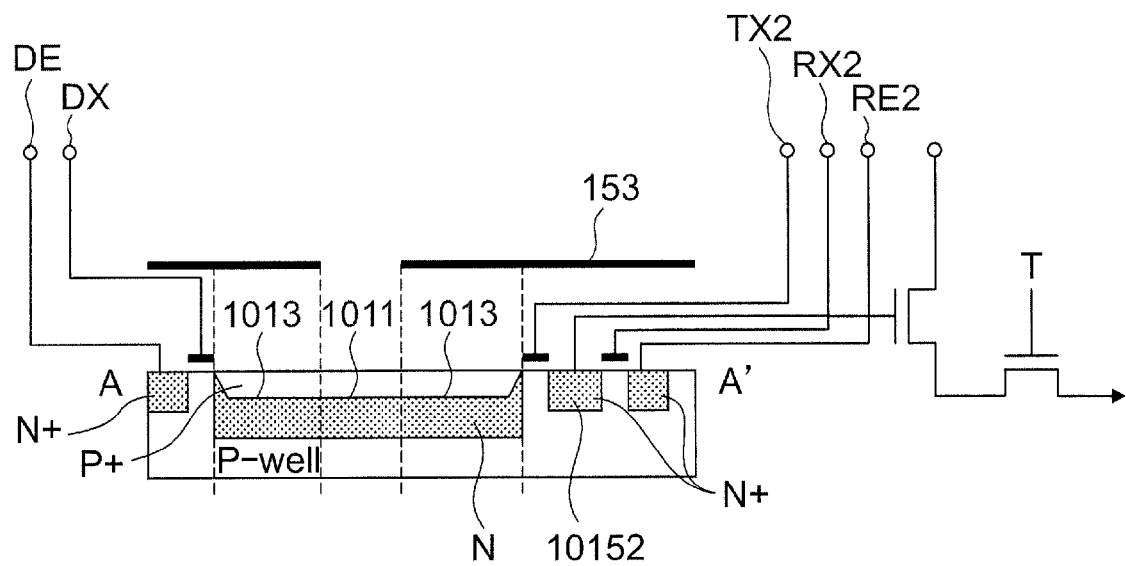

FIGS. 20A and 20B illustrate a configuration of the pixel shown in FIG. 3 in detail. FIG. 20B shows cross section A-A', which is indicated in FIG. 20A. Length of a side of the pixel is 12 micrometers.

The pixel is provided with a drain electrode DE, a drain gate section DX, four photoelectric converting sections 1011, a charge transfer section 1013, four transfer gate sections TX1, TX2, TX3 and TX4, four charge storage sections 10151, 10152, 10153 and 10154, four reset gate sections RX1, RX2, RX3 and RX4 and four reset electrodes RE1, RE2, RE3 and RE4. In FIGS. 20A and 20B, references are given only to the portions shown along the cross section.

As shown in FIG. 20B, the photoelectric converting section 1011 and the charge transfer section 1013 are photodiode regions. Regions except for the photoelectric converting section 1011 are covered with light shielding films 153. When light enters the photoelectric converting section 1011, pairs of a free electron and a free hole are generated. A conventional pixel provided with a photoelectric converting section and a charge transfer section is described in JP2-304974A, for example.

Free electrons, in other words charge, generated by the photoelectric converting section 1011 are collected in the charge transfer section 1013. Charge collected in the charge transfer section 1013 is transferred to one of the four charge storage sections 10151, 10152, 10153 and 10154 through four transfer gate sections TX1, TX2, TX3 and TX4, respectively. The four reset gate sections RX1, RX2, RX3 and RX4 and the four reset electrodes RE1, RE2, RE3 and RE4 are used to discharge charge stored in the four charge storage sections 10151, 10152, 10153 and 10154, respectively.

As shown in FIG. 20A, the drain gate section DX and the drain electrode are surrounded by the charge transfer section 1013. Accordingly, free electrons move from the photoelectric converting section 1011 to the charge storage section 10152, for example, passing through a portion of the photodiode region around the drain gate section DX.

A maximum diameter among diameters of circles which can exist in an area in the photodiode region through which free electrons can pass is referred to as a width of a free electron passing region in the photodiode region. For the pixel provided with the drain gate section DX and the drain electrode DE shown in FIG. 20A, a circle with the maximum diameter among circles which can exist in the surface of a region in the photodiode region through which free electrons can pass is represented as B. The width of the free electron passing region in the photodiode region is approximately 1.9 micrometers. For a pixel which has been formed by removing the drain gate section DX and the drain electrode DE from the pixel shown in FIG. 20A, a circle with the maximum diameter among circles which can exist in the surface of a region in the photodiode region through which free electrons can pass is represented as C. The width of the free electron passing region in the photodiode region is approximately 0.5 micrometers.

Charge transfer time from the photoelectric converting section 1011 to the charge storage section 10152 will be examined below. An amount of charge which is stored in the charge storage section 10152 when the transfer gate TX2 is opened for adequate time (for example, 400 microseconds) after pulse light illumination, is defined as E. If an amount of charge which is stored in the charge storage section 10152 when the transfer gate TX2 is opened for a shorter time is represented as et, untransferred charge ratio is defined as below.

Untransferred charge ratio=$((E-et)/E) \times 100(\%)$

Figure 29:
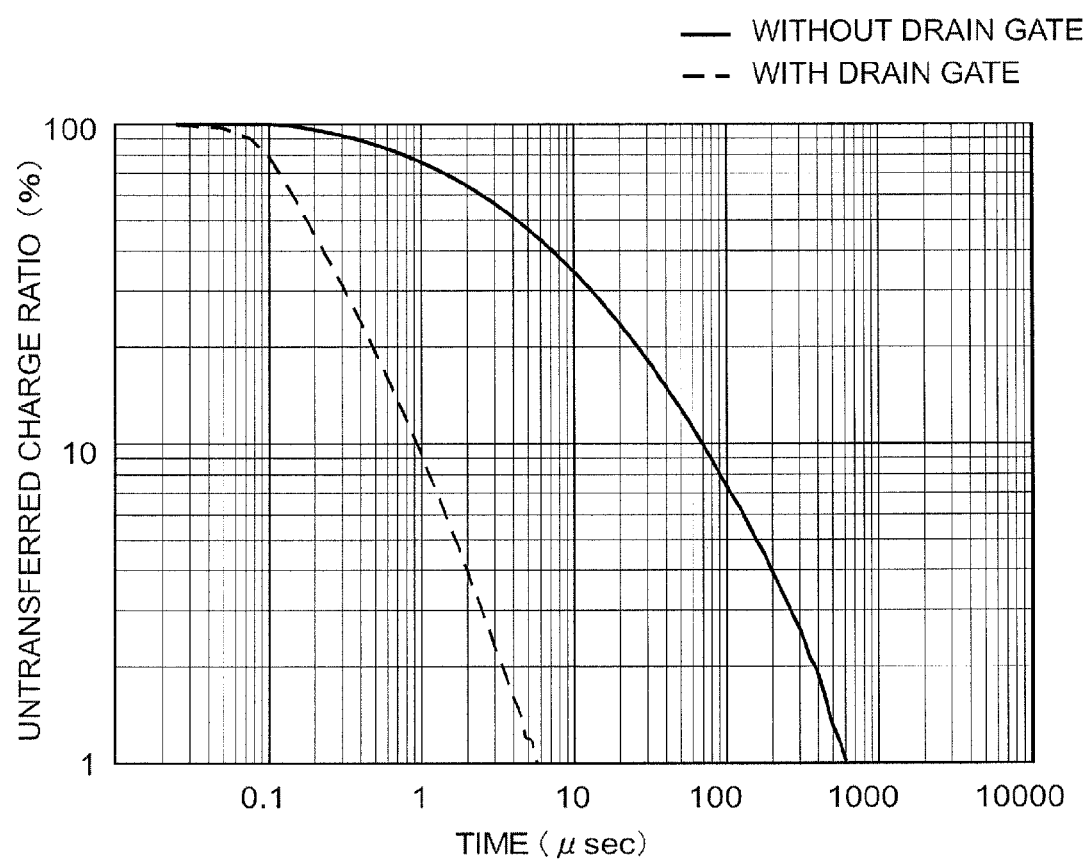
FIG. 29 shows relationships between untransferred charge ratio and time for the pixel with the drain gate section and the drain electrode in the charge transfer section and for the pixel without them.

FIG. 29 shows relationships between untransferred charge ratio and time for the pixel with the drain gate section DX and the drain electrode DE in the charge transfer section 1013 and for the pixel without them. The horizontal axis in FIG. 29 represents time in logarithmic scale. The vertical axis in FIG. 29 represents untransferred charge ratio in logarithmic scale. In FIG. 29, the solid line represents the case without the drain gate section DX and the drain electrode DE in the charge transfer section 1013 while the dotted line represents the case with the drain gate section DX and the drain electrode DE in the charge transfer section 1013. In the case without the drain gate section DX and the drain electrode DE, charge transfer time which is necessary for the untransferred charge ratio to become 1% or less is 600 microseconds while in the case with the drain gate section DX and the drain electrode DE, charge transfer time which is necessary for the untransferred charge ratio to become 1% or less is 6 microseconds. Thus, charge transfer time which is necessary for the untransferred charge ratio to become 1% for the case with the drain gate section DX and the drain electrode DE is one hundredth of that for the case without the drain gate section DX and the drain electrode DE.

Similar effects can be gained when the drain gate section DX and the drain electrode DE are replaced with a region in which an electron can hardly or not exist. Such a region in which an electron can hardly or not exist is referred to as an electron exclusion region in the text of specification and claims of the present application.

As described above, charge transfer time is a function of width of the free electron passing region, and charge transfer time is reduced as width of the free electron passing region is reduced. However, when width of the free electron passing region is too small, a potential in the free electron passing region becomes large so that charge transfer time becomes long.

Accordingly, charge transfer time can be minimized by changing shapes of the photodiode region and the electron exclusion region and thereby changing width of the free electron passing region. In general, considering a size of the pixel, width of the free electron passing region should preferably be determined in a range from 0.5 micrometers to 5 micrometers. Particularly, a range from 1 micrometer to 2 micrometers is more preferable. Charge transfer time of a conventional pixel of a similar type is several hundred microseconds. In the pixel according to embodiments of the present invention, charge transfer time can be reduced to 10 micrometers or less provided that width of the free electron passing region is set at an appropriate value in the range described above.

It should be noted that it has been conventionally believed that transfer time of electrons would be increased when an obstacle such as the electron exclusion region is provided in the photodiode region. Accordingly, it is completely new findings of the inventor that charge transfer time can be minimized by changing shapes of the photodiode region and the electron exclusion region provided in the photodiode region and thereby changing width of the free electron passing region and that charge transfer time can be reduced to 10 microseconds or less when width of the free electron passing region is set at such as an appropriate value as described above.

Figure 30:
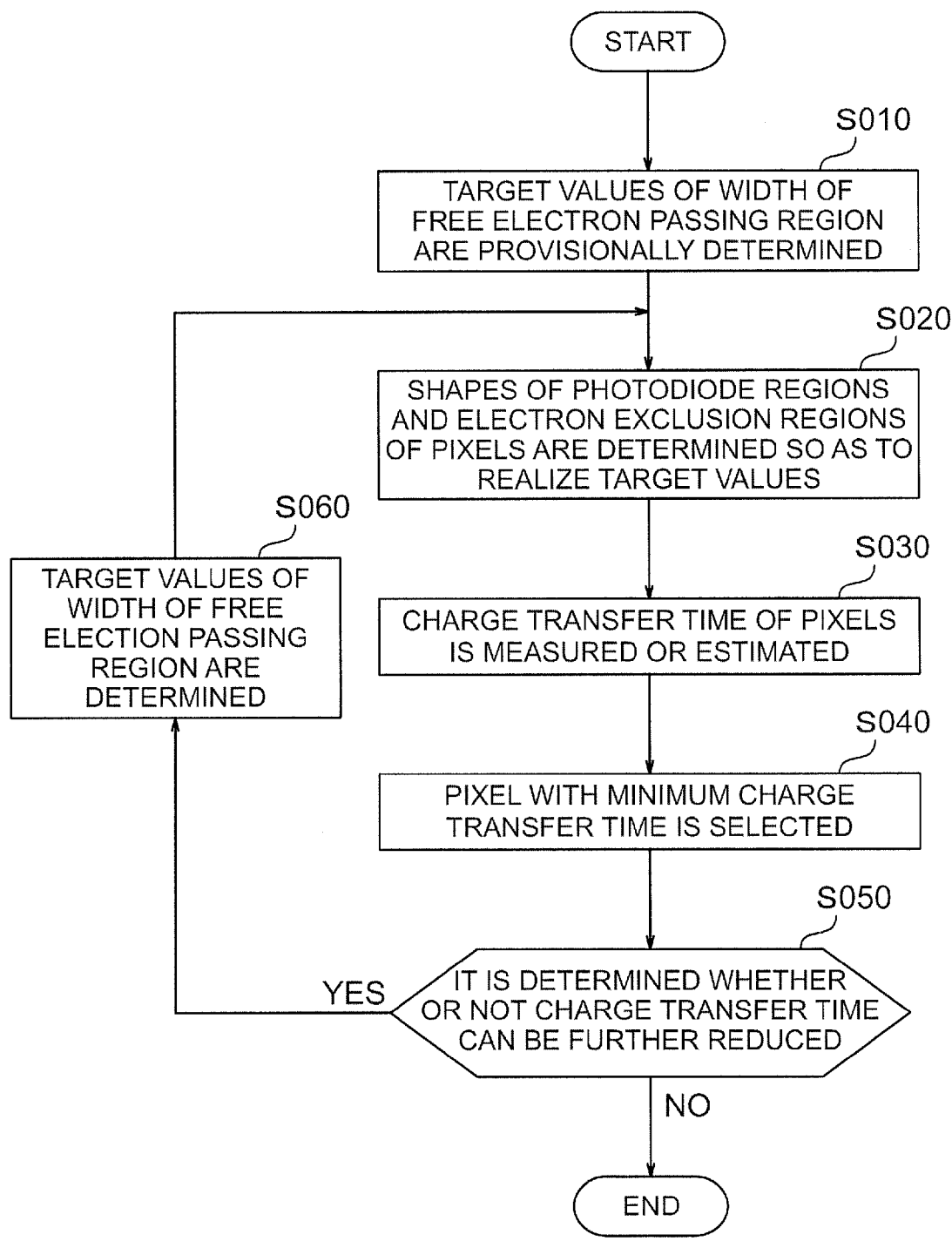
FIG. 30 is a flowchart which shows a process for manufacturing a pixel with minimum charge transfer time.

FIG. 30 is a flowchart which shows a process for manufacturing a pixel with minimum charge transfer time.

In step S010 of FIG. 30, a plurality of target values of width of the free electron passing region are provisionally determined.

In step S020 of FIG. 30, shapes of photodiode regions and electron exclusion regions of a plurality of pixels are determined in such a way that the plurality of target values of width of the free electron passing region are realized.

In step S030 of FIG. 30, the plurality of pixels are made and their values of charge transfer time are measured. Alternatively, the values of charge transfer time of the plurality of pixels may be estimated through simulation.

In step S040 of FIG. 30, the pixel with minimum charge transfer time is selected from the above-described plurality of pixels.

In step S050 of FIG. 30, it is determined whether or not charge transfer time can be further reduced based on a relationship between the plurality of values of width of the free electron passing region and the corresponding plurality of values of charge transfer time. For example, it is determined that charge transfer time can further be reduced by decreasing or increasing width of the free electron passing region if charge transfer time monotonously increases or decreases as width of the free electron passing region increases in the data of the above-described plurality of pixels. If it is determined that charge transfer time can further be reduced, the process goes to step S060. If it is determined that charge transfer time cannot further be reduced, the process is terminated.

In step S060 of FIG. 30, a plurality of target values around the width of the free electron passing region of the pixel with minimum charge transfer time are determined and then the process goes to step S020.

Steps S010 to S060 described above may be carried out with any of a shape and a size of the photodiode region and a position, a shape and a size of the electron exclusion region fixed.

More specifically, when the number of the photoelectric converting sections or the charge storage sections is n (n is an integer which is 3 or more), the n photoelectric converting sections or charge storage sections may be arranged at the vertexes of a regular polygon with n sides and a shape of the photodiode region is determined in such a way that the photoelectric converting sections or the charge storage sections are connected with one another with the photodiode region. Further, when n is even, a shape of the photodiode region may be symmetric with respect to x axis and y axis of xy Cartesian coordinate system fixed on the plane. A shape of the electron exclusion region may be a circle with its center fixed at the center of the regular polygon with n sides or at the origin of the xy Cartesian coordinate system. A value of diameter of the circle may be changed to realize the plurality of target values of width of the free electron passing region (step S020). A shape of the electron exclusion region may be a regular polygon.

More specifically, the electron exclusion region is a region other than a photodiode region, a photodiode region in which ion concentration is reduced so that electron can hardly exist or the like. Embodiments of pixels with various electron exclusion regions will be described below.

Figure 21A:
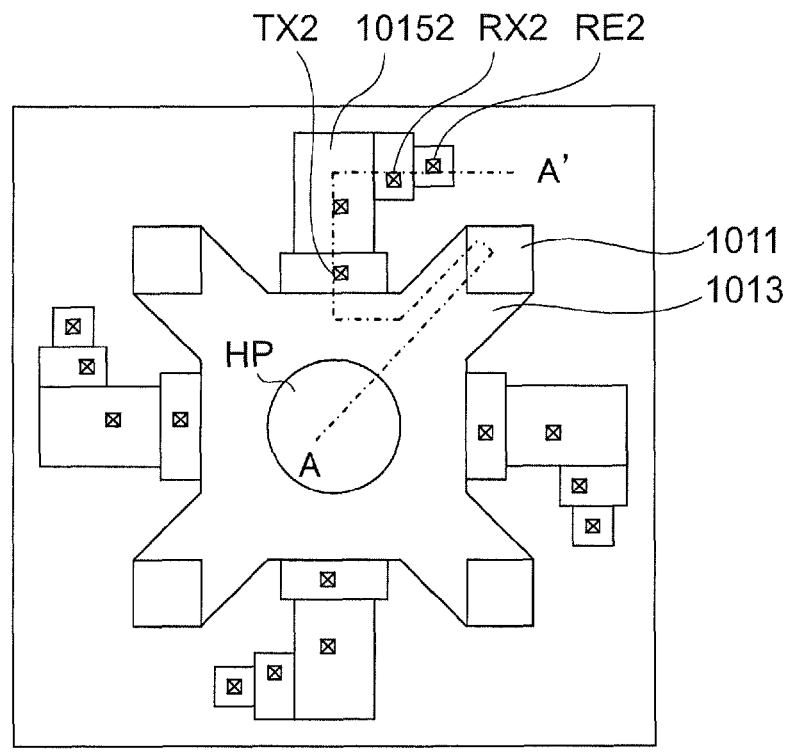
FIGS. 21A and 21B show a configuration of a pixel in which a p-type well is used as the electron exclusion region.
Figure 21B:
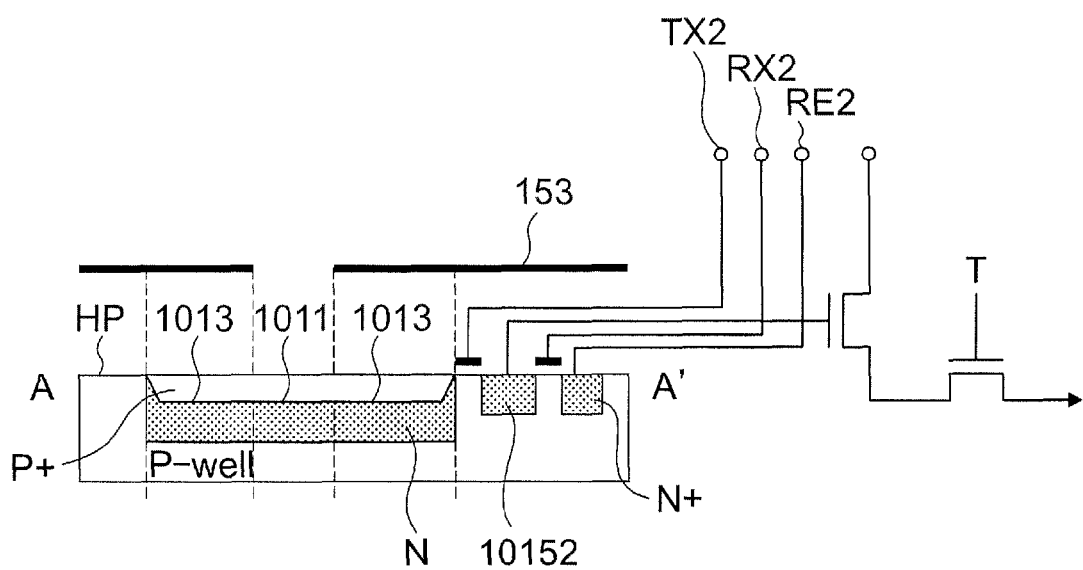

FIGS. 21A and 21B show a configuration of a pixel in which a p-type well is used as the electron exclusion region. FIG. 21B shows cross section A-A', which is shown in FIG. 21A. Configuration excluding the electron exclusion region HP is similar to that of FIG. 20.

Figure 22A:
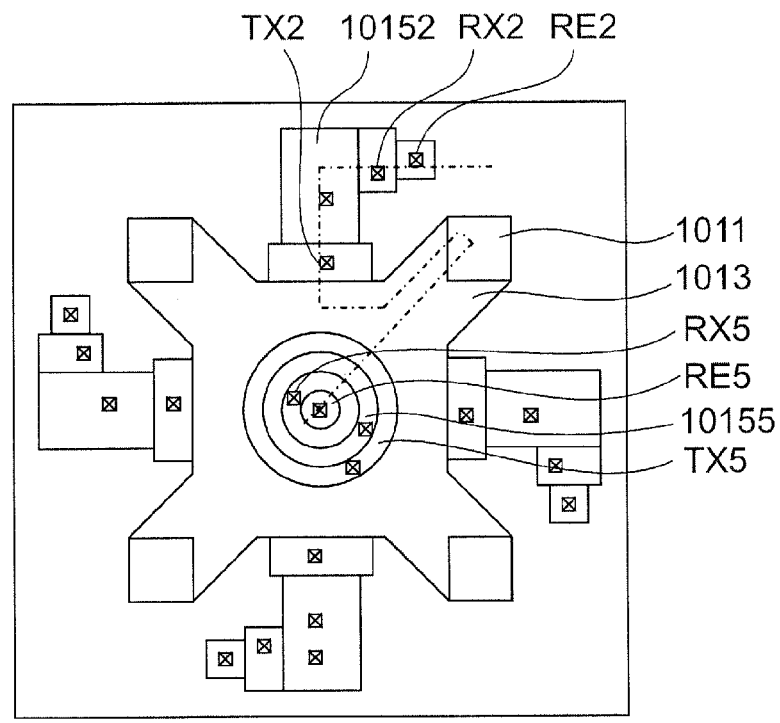
FIGS. 22A and 22B show a configuration of a pixel in which the charge storage section and the transfer gate section are used as the electron exclusion region.
Figure 22B:
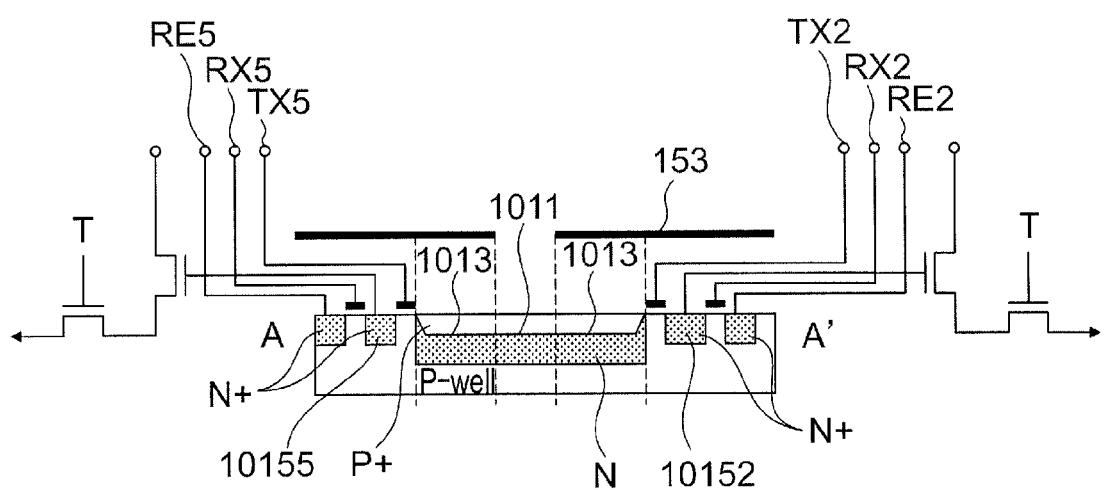

FIGS. 22A and 22B show a configuration of a pixel in which the charge storage section 10155 and the transfer gate section TX5 are used as the electron exclusion region. FIG. 22B shows cross section A-A', which is shown in FIG. 22A. Configuration excluding the electron exclusion region is similar to that of FIG. 20. The pixel of FIGS. 22A and 22B is provided with five charge storage sections 10151 to 10155.

Figure 23A:
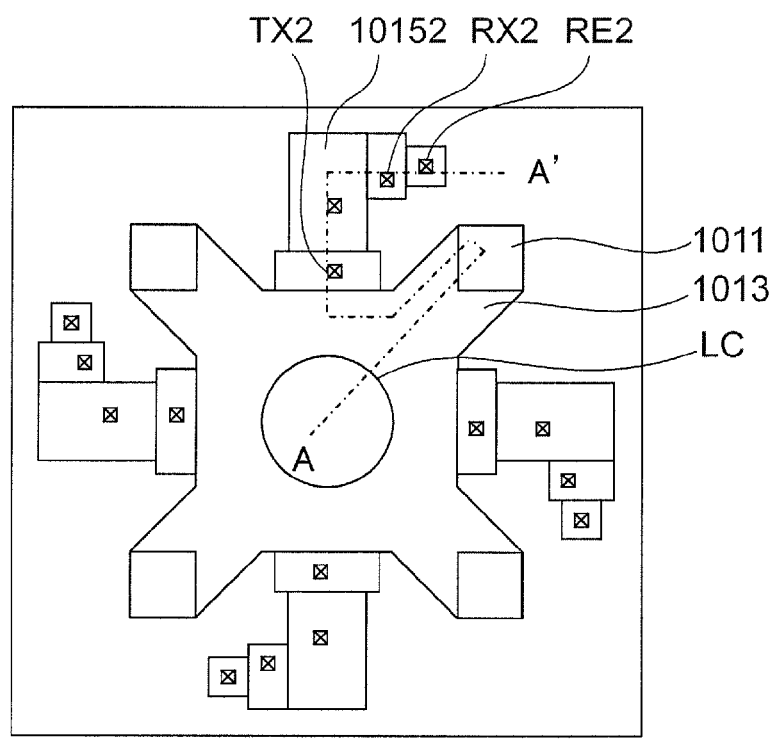
FIGS. 23A and 23B show a configuration of a pixel in which a photodiode region in which ion concentration is reduced so that electron can hardly exist is used as the electron exclusion region.
Figure 23B:
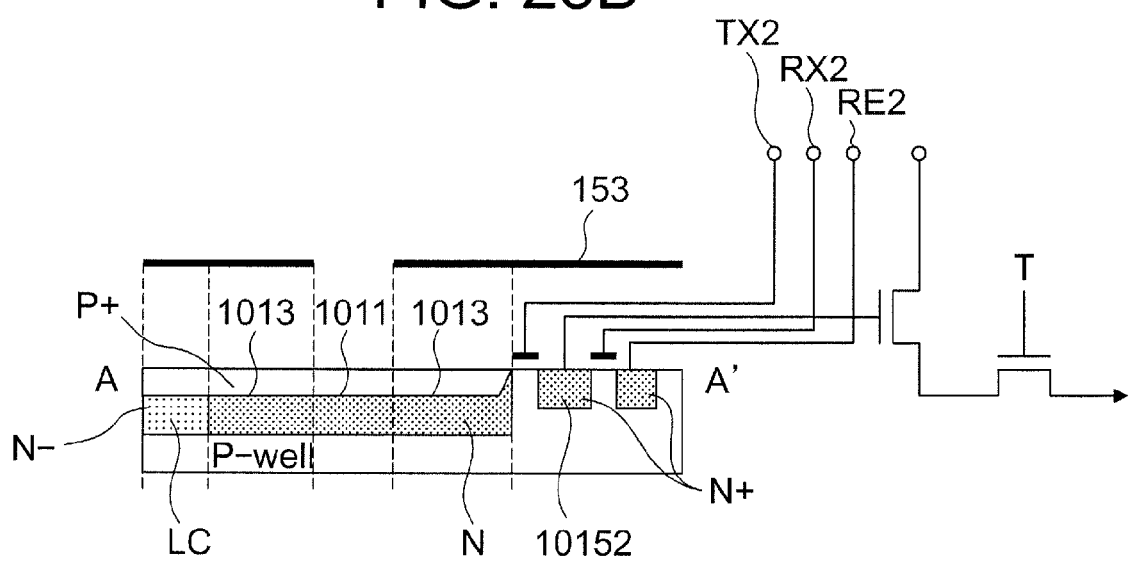

FIGS. 23A and 23B show a configuration of a pixel in which a photodiode region LC in which ion concentration is reduced so that electron can hardly exist is used as the electron exclusion region. FIG. 23B shows cross section A-A', which is shown in FIG. 23A. Configuration excluding the electron exclusion region HP is similar to that of FIG. 20.

Figure 24A:
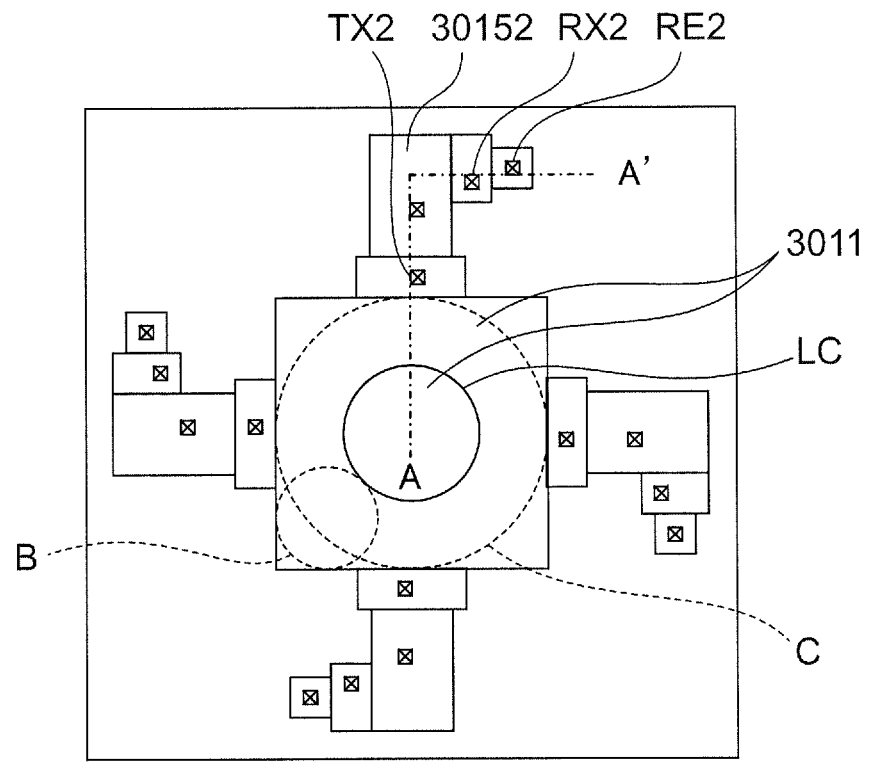
FIGS. 24A and 24B show a configuration of a pixel which is not provided with a charge transfer section.
Figure 24B:
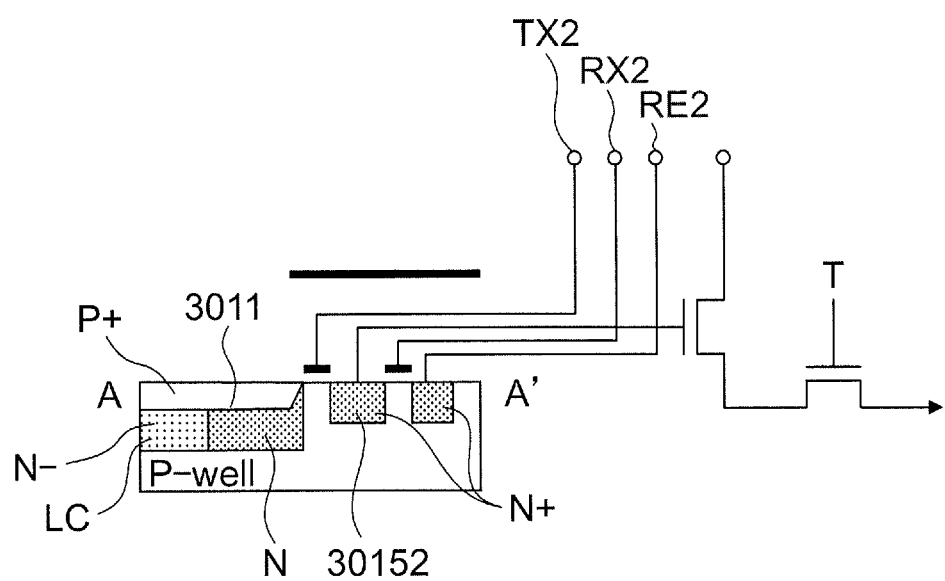

FIGS. 24A and 24B show a configuration of a pixel which is not provided with a charge transfer section. FIG. 24B shows cross section A-A', which is shown in FIG. 24A. Length of a side of the pixel is 12 micrometers.

The pixel is provided with a photoelectric converting section 3011, four transfer gate sections TX1, TX2, TX3 and TX4, four charge storage sections 30151, 30152, 30153 and 30154, four reset gate sections RX1, RX2, RX3 and RX4 and four reset electrodes RE1, RE2, RE3 and RE4. In FIGS. 24A and 24B, references are given only to the portions shown along the cross section.

As shown in FIG. 24B, the photoelectric converting section 3011 is a photodiode region. When light enters the photoelectric converting section 3011, pairs of a free electron and a free hole are generated.

Free electrons, in other words charge, generated by the photoelectric converting section 3011 are transferred to one of the four charge storage sections 30151, 30152, 30153 and 30154 through the four transfer gate sections TX1, TX2, TX3 and TX4 respectively. The four reset gate sections RX1, RX2, RX3 and RX4 and the four reset electrodes RE1, RE2, RE3 and RE4 are used to discharge charge stored in the four charge storage sections 30151, 30152, 30153 and 30154, respectively.

As shown in FIGS. 24A and 24B, a photodiode region LC in which ion concentration is reduced so that electron can hardly exist, in other words an electron exclusion region LC is provided within the photoelectric converting section 3011. Accordingly, free electrons travel around the electron exclusion region LC in the photodiode region from the photoelectric converting section 3011 to the charge storage section 30152, for example. With the electron exclusion region LC provided, a circle with maximum diameter which can exist in an area of the photodiode region in which free electrons can travel is represented as B and a width of the free electron passing region in the photodiode region is approximately 1.9 micrometers. Without an electron exclusion region LC provided, a circle with maximum diameter which can exist in an area of the photodiode region in which free electrons can travel is represented as C and a width of the free electron passing region in the photodiode region is approximately 5 micrometers.

Figure 25:
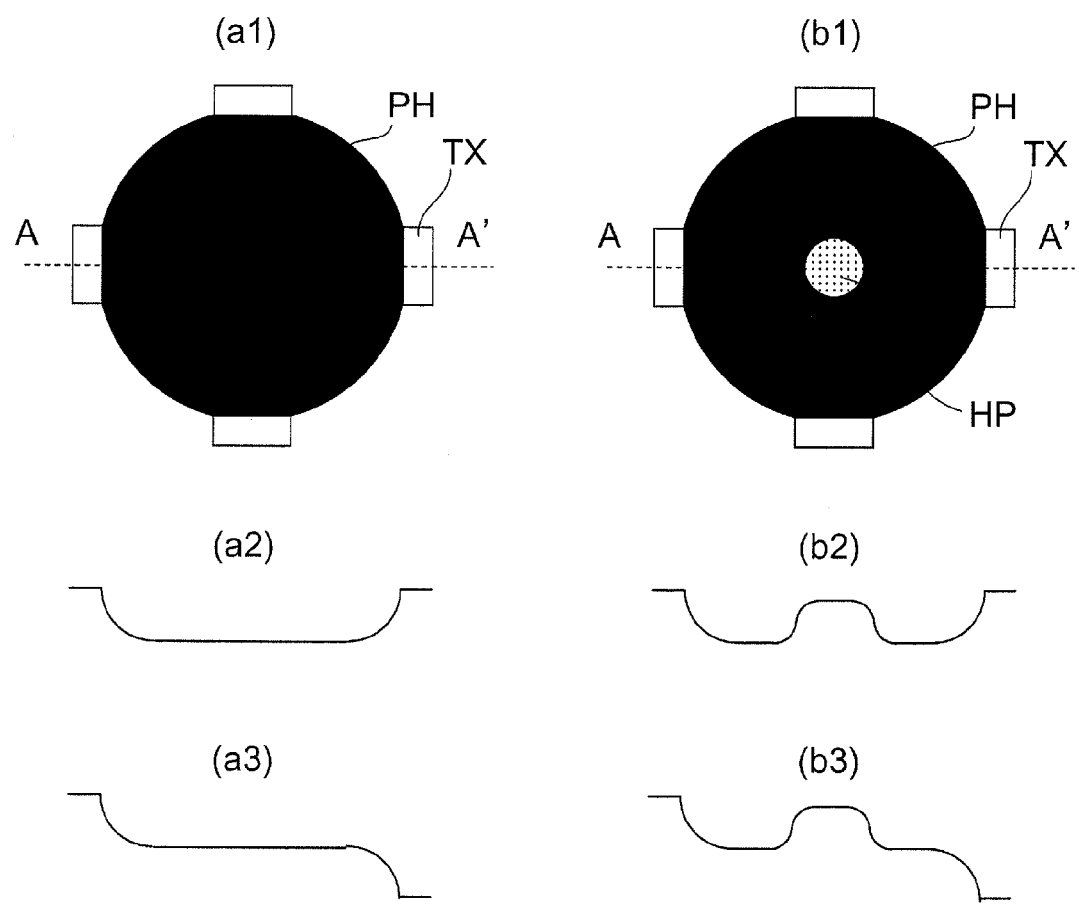
FIG. 25 shows potential of a pixel without a charge transfer section in conceptual illustration.

FIG. 25 shows potential of a pixel without a charge transfer section in conceptual illustration.

FIG. 25(a1) is a top view of a pixel without an electron exclusion region. The pixel is provided with a photoelectric converting section PH and four transfer gates TX. Each transfer gate TX is further provided with a charge storage section, a reset gate and a reset electrode, which are omitted in FIG. 25(a1). FIG. 25(a2) shows in conceptual illustration potential along the cross section A-A' shown in FIG. 25(a) generated when the transfer gates TX are closed. FIG. 25(a3) shows in conceptual illustration potential along the cross section A-A' shown in FIG. 25(a) generated when the transfer gates TX are open.

FIG. 25(b1) is a top view of a pixel with an electron exclusion region. The pixel is provided with a photoelectric converting section PH, an electron exclusion region HP and four transfer gates TX. Each transfer gate TX is further provided with a charge storage section, a reset gate and a reset electrode, which are omitted in FIG. 25(b1). FIG. 25(b2) shows in conceptual illustration potential along the cross section A-A' shown in FIG. 25(b) generated when the transfer gates TX are closed. FIG. 25(b3) shows in conceptual illustration potential along the cross section A-A' shown in FIG. 25(b) generated when the transfer gates TX are open. A region in which electrons can travel is restricted by a high potential region corresponding to the electron exclusion region HP.

Figure 26:
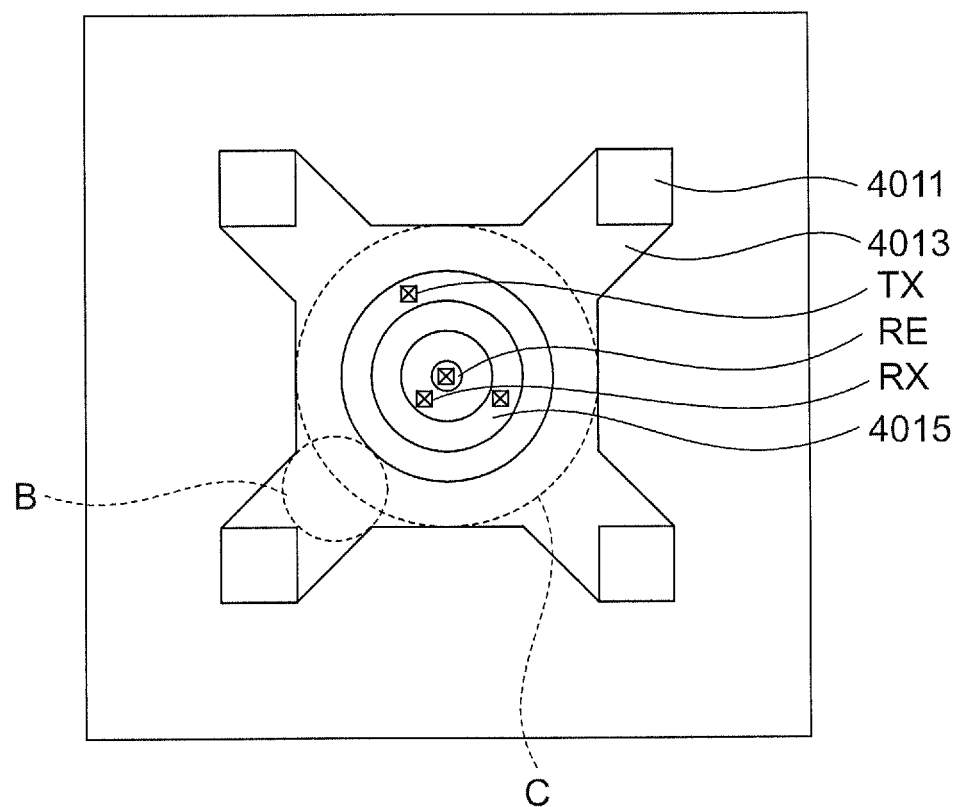
FIG. 26 shows a configuration of a pixel with a charge storage section at the center.

FIG. 26 shows a configuration of a pixel with a charge storage section at the center. Length of a side of the pixel is 12 micrometers.

The pixel is provided with four photoelectric converting sections 4011, a charge transfer section 4013, one transfer gate section TX, one charge storage section 4015, one reset gate section RX and one reset electrode RE. The present pixel does not have a plurality of transfer gates and a plurality of charge storage sections, and therefore it cannot be used for the purpose of broadening a dynamic range through dividing charge.

Free electrons, in other words charge generated in the photoelectric converting sections 4011 are transferred through the transfer gate section TX and stored in the charge storage section 4015. The reset gate section RX and the reset electrode RE are used to discharge charge stored in the charge storage section 4015.

As shown in FIG. 26, the transfer gate section TX and the charge storage section 4015 are provided within the charge transfer section 4013. Accordingly, free electrons travel around the transfer gate section TX and the charge storage section 4015 in the photodiode region from the photoelectric converting section 4011 to the charge storage section 4015. With the transfer gate section TX and the charge storage section 4015 provided, a circle with maximum diameter which can exist in an area of the photodiode region through which free electrons can pass is represented as B and a width of the free electron passing region in the photodiode region is approximately 1.8 micrometers. Without an electron exclusion region provided, a circle with maximum diameter which can exist in an area of the photodiode region through which free electrons can pass is represented as C and a width of the free electron passing region in the photodiode region is approximately 5 micrometers.

Figure 27:
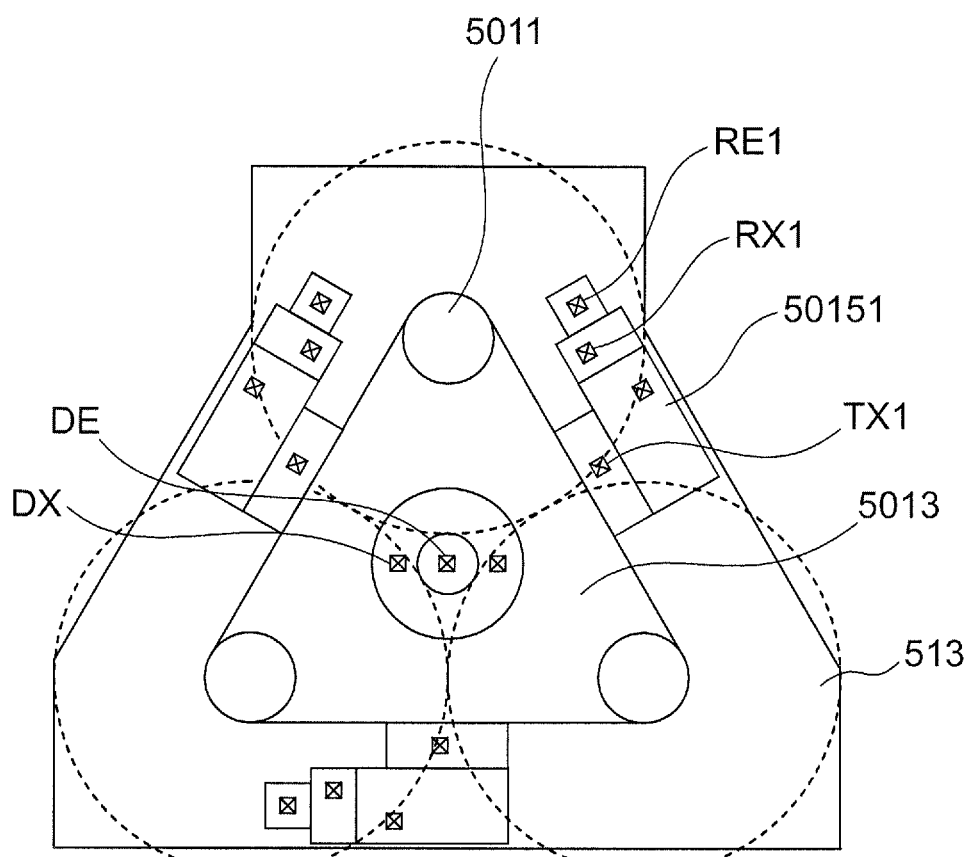
FIG. 27 shows a configuration of a pixel provided with three photoelectric converting sections and three charge storage sections.

FIG. 27 shows a configuration of a pixel provided with three photoelectric converting sections and three charge storage sections. The three photoelectric converting sections are arranged in such a way the centers are at the vertexes of an equilateral triangle. Provided that circular micro-lenses 513 are used, spaces between the micro-lenses can be reduced when tree micro-lenses are arranged as shown in FIG. 27 compared with the case in which four micro-lenses are arranged as shown in FIGS. 19A to 19C. As a result, an amount of collected light per unit area is increased by 3%.

The pixel is provided with three photoelectric converting sections 5011, a charge transfer section 5013, three transfer gate sections TX1, TX2 and TX3, three charge storage sections 50151, 50152 and 50153, three reset gate sections RX1, RX2 and RX3 and three reset electrodes RE1, RE2 and RE3.

Free electrons, in other words charge generated by the photoelectric converting sections 5011 are transferred to one of the three charge storage sections 50151, 50152 and 50153 through the three transfer gate sections TX1, TX2 and TX3, respectively. The three reset gate sections RX1, RX2 and RX3 and the three reset electrodes RE1, RE2 and RE3 are used to discharge charge stored in the three charge storage sections 50151, 50152 and 50153, respectively.

As shown in FIG. 27, a drain gate section DX and a drain electrode DE are provided within the charge transfer section 5013. Accordingly, free electrons travel around the drain gate section DX and the drain electrode DE in the photodiode region from the photoelectric converting section 5011 to the charge storage section 50151, for example.

Figure 28:
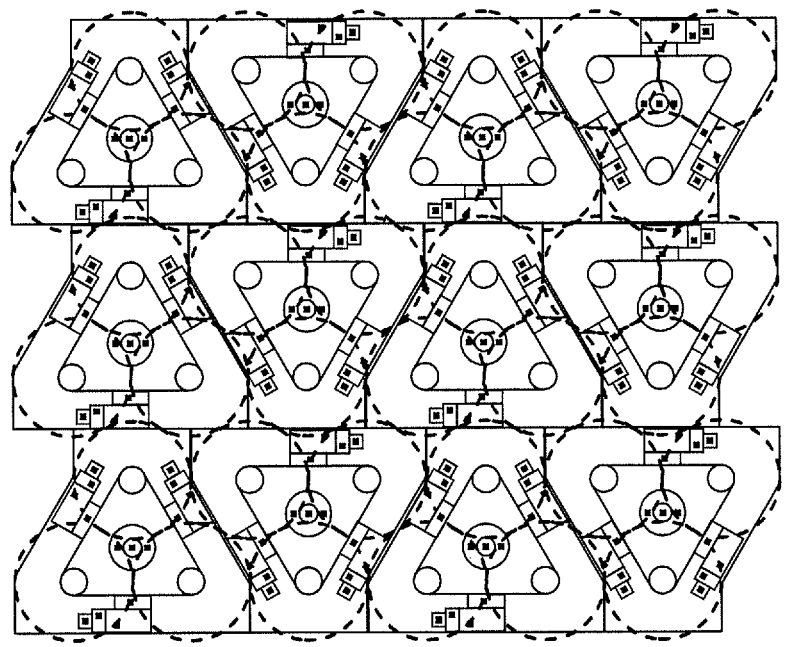
FIG. 28 shows a plurality of pixels arranged on a plane, each of which is illustrated in FIG. 27.

FIG. 28 shows a plurality of pixels arranged on a plane, each of which is illustrated in FIG. 27.

Pixels shown in FIGS. 19A to 27 are provided with a plurality of photoelectric converting sections inside and on the edge of the photodiode region and/or a plurality of charge storage sections outside and on the edge of the photodiode region and the electron exclusion region at the center of the photodiode region. However, the present invention can be applied to other configurations.

In the embodiments described above, pixels in which free electrons function as charge carriers are described. The present invention can be applied to pixels in which holes in place of free electrons function as charge carriers by replacing the electron exclusion region with a hole exclusion region.

The embodiments according to the present invention are featured as described below.

In a pixel according to an embodiment of the present invention, the width of the free electron passing region is determined in such away that charge transfer time from the photoelectric converting section to the charge storage section is minimized.

Accordingly, a pixel with minimum charge transfer time can be obtained according to the present embodiment.

In a pixel according to an embodiment of the present invention, the width of the free electron passing region is determined in such a way that charge transfer time from the photoelectric converting section to the charge storage section is 10 microseconds or less.

Accordingly, a pixel with charge transfer time of 10 microseconds or less can be obtained according to the present embodiment.

In a pixel according to an embodiment of the present invention, the electron exclusion region is a region other than the photodiode region or a photodiode region in which ion concentration is reduced.

Electrons cannot exist in a region other than the photodiode region, and therefore the region other than the photodiode region functions as an electron exclusion region. Further, a photodiode region in which ion concentration is reduced has a high potential so that electrons travel around the region. Accordingly, the photodiode region in which ion concentration is reduced functions as an electron exclusion region.

A pixel according to an embodiment of the present invention includes a plurality of photoelectric converting sections and/or a plurality of charge storage sections.

According to the present embodiment, a pixel which is provided with a plurality of photoelectric converting sections and/or a plurality of charge storage sections and has a short charge transfer time can be obtained.

In a pixel according to an embodiment of the present invention, the photodiode region further includes a charge transfer section which transfers charge generated in the photoelectric converting section to the charge storage section.

In a pixel which includes a charge transfer section besides the photoelectric converting section, a value of width of a free electron passing region in the photodiode region can be set so as to realize an appropriate charge transfer time.

In an imaging device according to an embodiment of the present invention, the imaging control section is arranged to function in such a way that amounts of charge are stored for different periods of exposure time in at least two of the plurality of charge storage sections of each pixel for the object.

According to the imaging device according to the present embodiment, an image with a wide dynamic range can be formed by utilizing outputs caused by amounts of charge which are stored for different periods of exposure time in at least two of the plurality of charge storage sections of each pixel for the object.

An imaging device according to an embodiment of the present invention further includes illuminating means for illuminating an object which is connected to the imaging control section. The imaging control section controls the illuminating means in such a way that amounts of charge are stored under different illuminating conditions in at least two of the plurality of charge storage sections of each pixel for the object.

According to the imaging device according to the present embodiment, an image with a wide dynamic range can be formed by utilizing outputs caused by amounts of charge which are stored under different illuminating conditions in the plurality of charge storage sections for the object.

In an imaging device according to an embodiment of the present invention, at least two of the plurality of charge storage sections of each pixel have different charge storage capacities.

According to the imaging device according to the present embodiment, even when exposure time and illuminating conditions are not changed for the object, outputs (voltage values) of the plurality of charge storage sections are different. An image with a wide dynamic range can be obtained by utilizing the outputs.

An imaging device according to an embodiment of the present invention further includes a difference output section which reads a difference between outputs of the plurality of charge storage sections of each pixel.

According to the imaging device according to the present embodiment, an image with a wide dynamic range can be obtained by utilizing the difference between outputs of the plurality of charge storage sections of each pixel.

In a method for forming an image according to an embodiment of the present invention, amounts of charge are stored for different periods of exposure time in at least two of the plurality of charge storage sections of each pixel for the object.

According to the method for forming an image according to the present embodiment, an image with a wide dynamic range can be obtained by utilizing outputs caused by amounts of charge stored for different periods of exposure time in at least two of the plurality of charge storage sections of each pixel for the object.

In a method for forming an image according to an embodiment of the present invention, amounts of charge are stored under different illuminating conditions in at least two of the plurality of charge storage sections of each pixel for the object, a difference between outputs of the plurality of charge storage sections of each pixel is obtained and an image is formed based on the difference of each pixel.

According to the method for forming an image according to the present embodiment, an image with a wide dynamic range can be obtained by utilizing the difference between outputs of the plurality of charge storage sections in which amounts of charge are stored under different illuminating conditions for the object.

In a method for forming an image according to an embodiment of the present invention, amounts of charge are stored under two or more types of illuminating conditions and for two or more periods of exposure time in at least four of the plurality of charge storage sections of each pixel for the object, differences between outputs of the plurality of charge storage sections of each pixel are obtained and an image is formed based on the differences of each pixel.

According to the method for forming an image according to the present embodiment, an image with a wide dynamic range can be obtained by utilizing the differences between outputs of the plurality of charge storage sections in which amounts of charge are stored under different illuminating conditions and for different periods of exposure time for the object.

In a method for forming an image according to an embodiment of the present invention, time in which charge is stored in each of the plurality of charge storage sections of each pixel is 100 microseconds or less and the number of repetition of charging operation is 100 or more.

According to the method for forming an image according to the present embodiment, an image of a moving object with a wide dynamic range can be formed with an accuracy which is sufficient from a practical standpoint.

EXPLANATION OF REFERENCE NUMERALS

101, 201 photosensitive section
103 difference output section
105, 205 imaging control section
203 synthesizing section

What is claimed is:

1. A pixel comprising:
   a photodiode region including a plurality of photoelectric converting sections which generate electrons when light is received;
   at least one charge storage section for storing charge; and
   a charge transfer section included in the photodiode region for transferring charge produced in the plurality of photoelectric converting sections to the at least one charge storage section, said charge transfer section being common to said plurality of photoelectric converting sections;
   wherein, with a maximum diameter among diameters of circles which exist in an area in the photodiode region through which free electrons pass defined as a width of a free electron passing region in the photodiode region, an electron exclusion region is provided such that the electron exclusion region reduces the width of the free electron passing region in the charge transfer section that is common to said plurality of photoelectric converting sections, thereby providing a shorter charge transfer time through the charge transfer section from the plurality of photoelectric converting sections to the at least one charge storage section,
   wherein the electron exclusion region is a region other than the photodiode region or a part of the photodiode region in which ion concentration is reduced, and
   wherein the electron exclusion region comprises a drain gate that regulates the charges in the charge transfer section.

2. A pixel according to claim 1, wherein the width of the free electron passing region is determined in such a way that charge transfer time from the plurality of photoelectric converting sections to the charge storage section is minimized.

3. A pixel according to claim 1, wherein the width of the free electron passing region is determined in such a way that charge transfer time from the plurality of photoelectric converting sections to the at least one charge storage section is 10 microseconds or less.

* * * * *